US012165976B2

(12) United States Patent
Kim et al.

(10) Patent No.: US 12,165,976 B2
(45) Date of Patent: Dec. 10, 2024

(54) THREE-DIMENSIONAL SEMICONDUCTOR DEVICE INCLUDING A THROUGH-VIA STRUCTURE HAVING A VIA LINER HAVING PROTRUDING PORTIONS

(71) Applicant: Samsung Electronics Co., Ltd., Suwon-si (KR)

(72) Inventors: Junhyoung Kim, Seoul (KR); Joongshik Shin, Yongin-si (KR); Kwangsoo Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 85 days.

(21) Appl. No.: 17/861,700

(22) Filed: Jul. 11, 2022

(65) Prior Publication Data
US 2022/0344267 A1 Oct. 27, 2022

Related U.S. Application Data

(63) Continuation of application No. 16/885,933, filed on May 28, 2020, now Pat. No. 11,387,184.

(30) Foreign Application Priority Data

Oct. 29, 2019 (KR) .................. 10-2019-0135208

(51) Int. Cl.
*H10B 41/27* (2023.01)
*H01L 21/768* (2006.01)
(Continued)

(52) U.S. Cl.
CPC ...... *H01L 23/535* (2013.01); *H01L 21/76805* (2013.01); *H01L 21/76816* (2013.01);
(Continued)

(58) Field of Classification Search
CPC ......... H01L 27/11582; H01L 27/11556; H01L 27/11565; H01L 27/11573; H01L 27/1157
See application file for complete search history.

(56) References Cited

U.S. PATENT DOCUMENTS 10,256,248 B2 4/2019 Lu et al.
10,269,620 B2 4/2019 Yu et al.
(Continued)

FOREIGN PATENT DOCUMENTS

KR 10-2019-0010137 A 1/2019

OTHER PUBLICATIONS

Office Action for Korean Application No. 10-2019-0135208 dated Mar. 22, 2024.

*Primary Examiner* — Tony Tran
(74) *Attorney, Agent, or Firm* — Harness, Dickey & Pierce, P.L.C.

(57) ABSTRACT

A three-dimensional semiconductor device may include a substrate having a cell area and an extension area, a word line stack disposed above the substrate, the word line stack including mold layers and word lines alternately stacked, vertical channel structures vertically penetrating the word line stack in the cell area, and a first extension through-via structure vertically penetrating the word line stack in the extension area. The first extension through-via structure may include a first via plug and a first via liner layer surrounding sidewalls of the first via plug. The first via liner layer may include first dents respectively disposed at the same levels horizontally as the word lines of the word line stack.

18 Claims, 35 Drawing Sheets

(51) Int. Cl.
　　　*H01L 23/522*　　(2006.01)
　　　*H01L 23/528*　　(2006.01)
　　　*H01L 23/535*　　(2006.01)
　　　*H10B 41/35*　　(2023.01)
　　　*H10B 41/41*　　(2023.01)
　　　*H10B 43/27*　　(2023.01)
　　　*H10B 43/35*　　(2023.01)
　　　*H10B 43/40*　　(2023.01)

(52) U.S. Cl.
　　　CPC .. *H01L 21/76831* (2013.01); *H01L 21/76877* (2013.01); *H01L 21/76895* (2013.01); *H01L 23/5226* (2013.01); *H01L 23/5283* (2013.01); *H10B 41/27* (2023.02); *H10B 41/35* (2023.02); *H10B 41/41* (2023.02); *H10B 43/27* (2023.02); *H10B 43/35* (2023.02); *H10B 43/40* (2023.02)

(56) References Cited

U.S. PATENT DOCUMENTS

| | | |
|---|---|---|
| 10,283,566 B2 | 5/2019 | Sel et al. |
| 10,355,009 B1 | 7/2019 | Kai et al. |
| 2018/0268902 A1 | 9/2018 | Tanaka |
| 2019/0164991 A1 | 5/2019 | Lim et al. |
| 2019/0280002 A1 | 9/2019 | Kai et al. |
| 2020/0075605 A1 | 3/2020 | Kim et al. |
| 2021/0050372 A1* | 2/2021 | Sharangpani .......... H10B 43/27 |

* cited by examiner

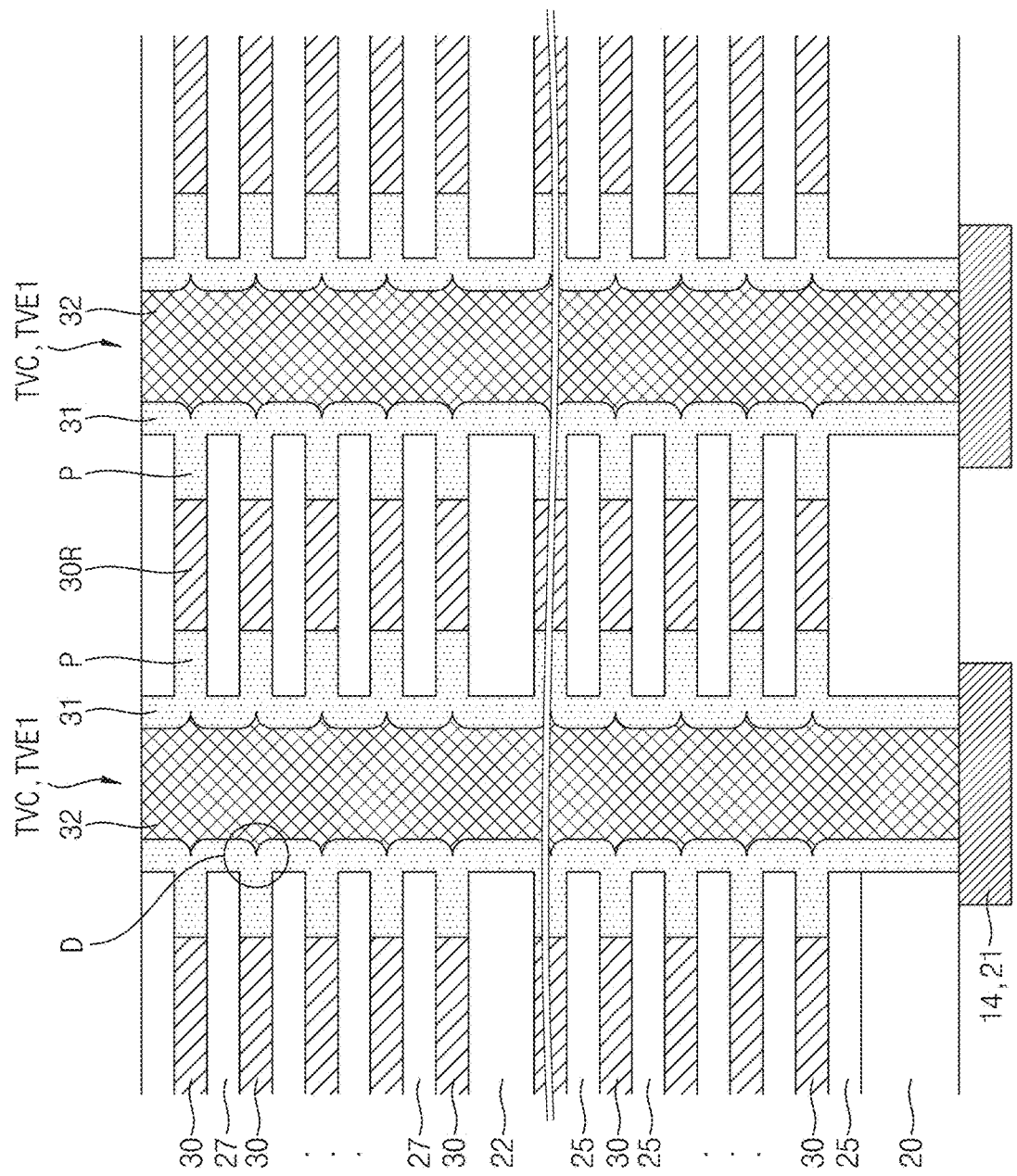

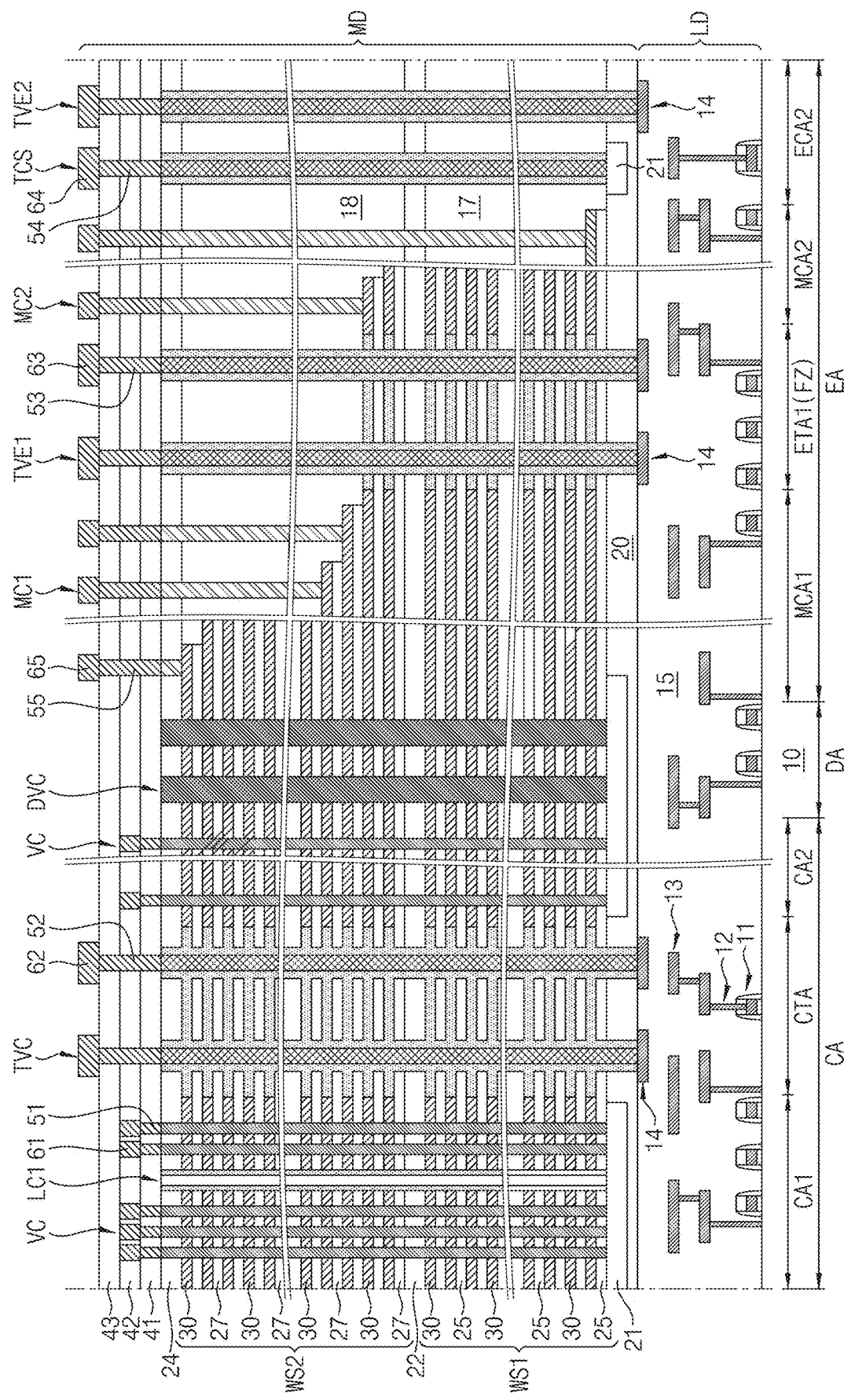

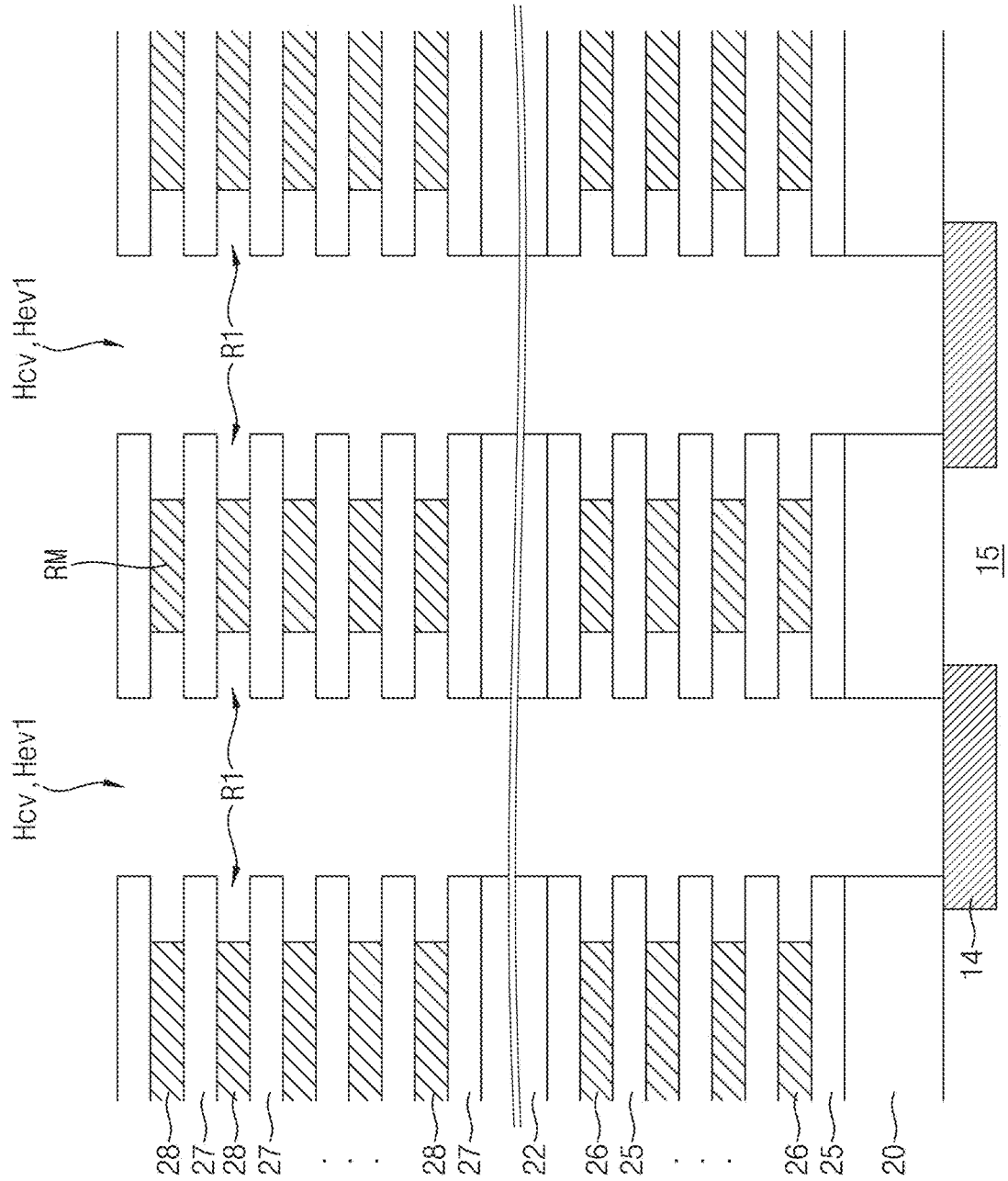

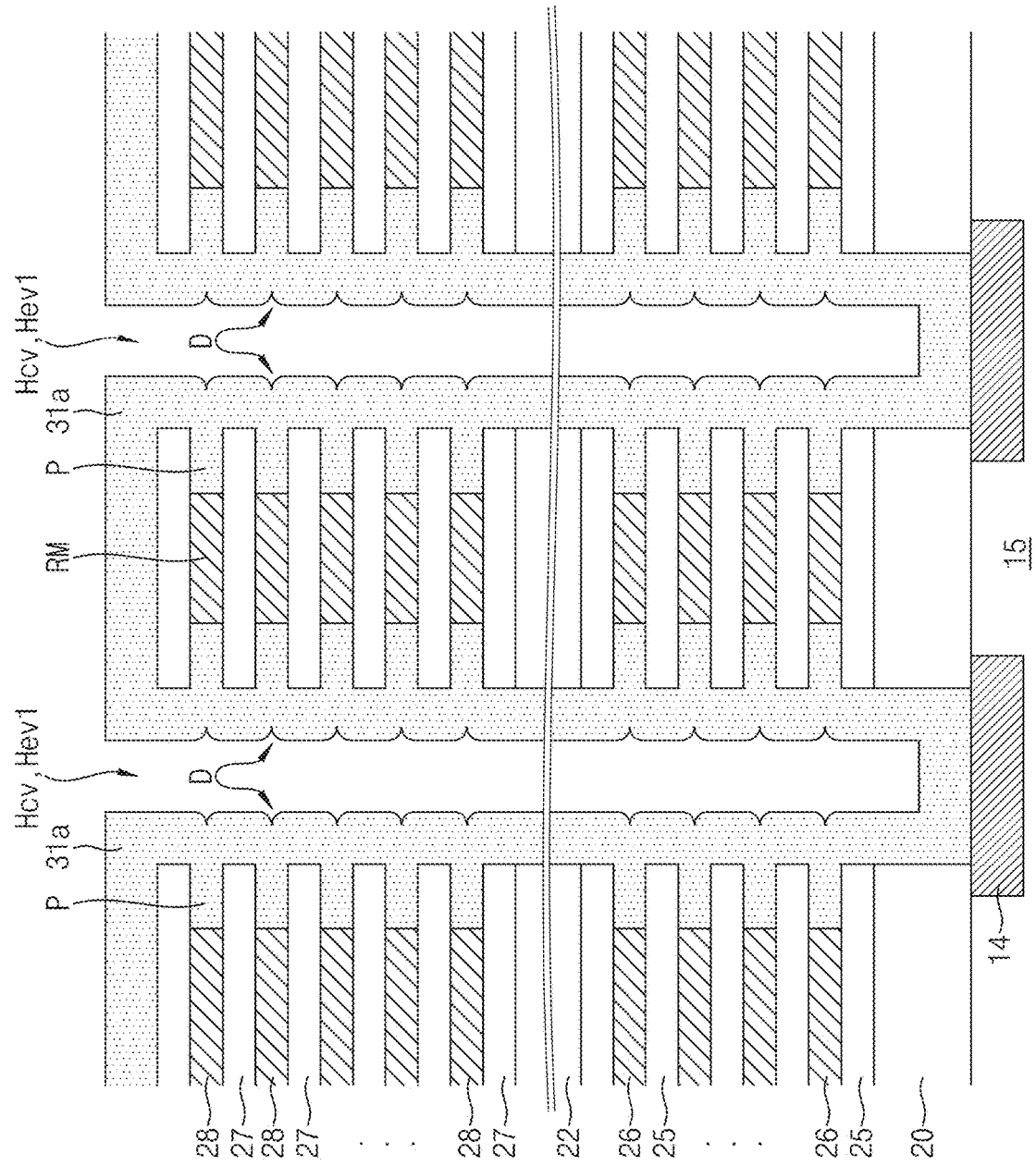

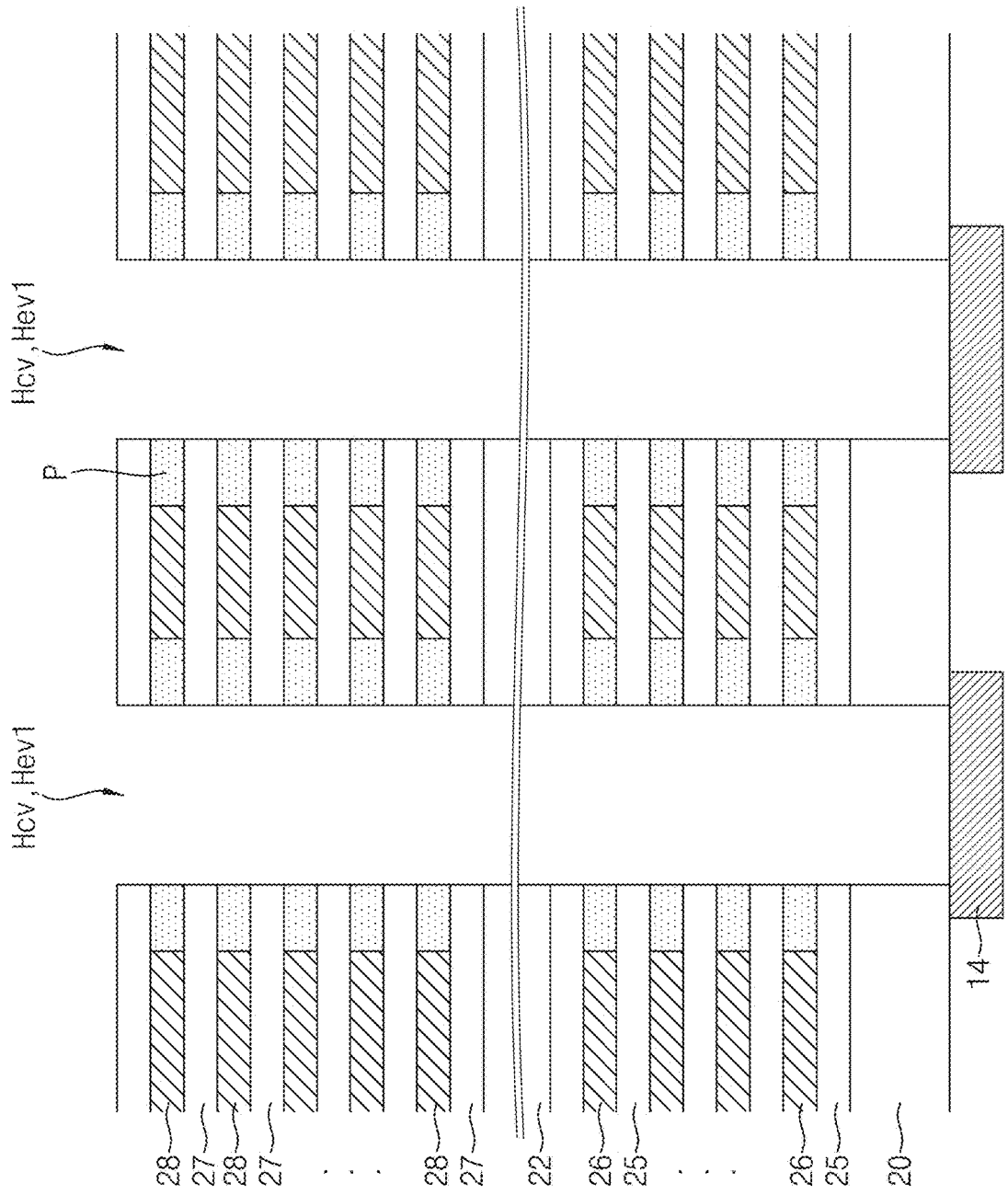

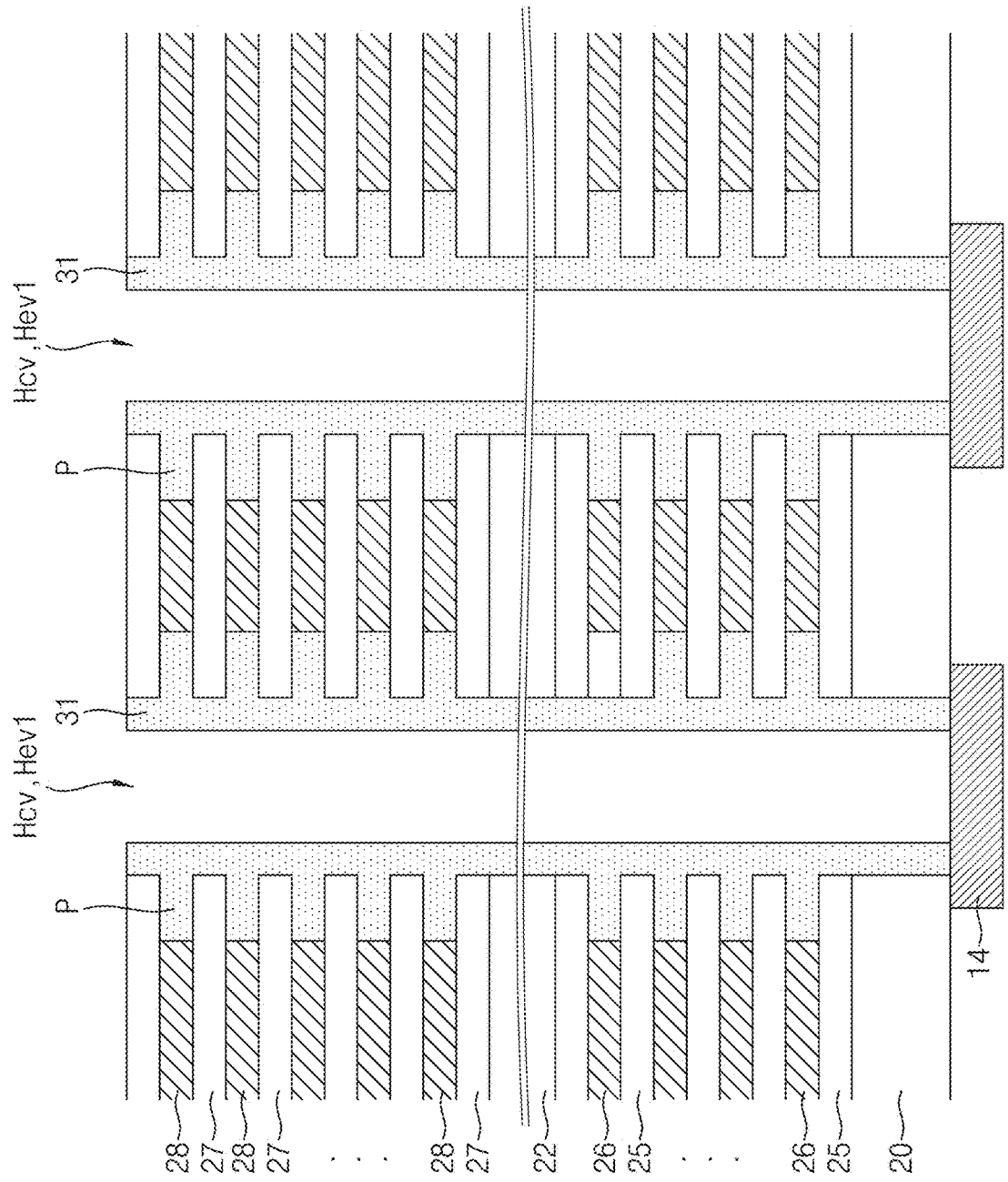

THREE-DIMENSIONAL SEMICONDUCTOR DEVICE INCLUDING A THROUGH-VIA STRUCTURE HAVING A VIA LINER HAVING PROTRUDING PORTIONS

CROSS-REFERENCE TO THE RELATED APPLICATION

The present application is a continuation under 35 U.S.C. § 120 of U.S. application Ser. No. 16/885,933, filed on May 28, 2020, which claims priority from Korean Patent Application No. 10-2019-0135208, filed on Oct. 29, 2019, in the Korean Intellectual Property Office, the disclosure of which is incorporated herein by reference in its entirety.

BACKGROUND

1. Field

The present disclosure relates to three-dimensional semiconductor devices comprising through-via structures having a protruding via liner layer and methods of forming the three-dimensional semiconductor device.

2. Description of the Related Art

As the degree of integration and stack height of a three-dimensional semiconductor device increases, the process of forming through-via structures for supplying power to a string select line becomes increasingly difficult. In particular, finer patterns and through-via structures should be formed, with the through-via structures sufficiently electrically insulated from the word lines.

SUMMARY

In some example embodiments of the disclosure provides a three-dimensional semiconductor device. The three-dimensional semiconductor device may include a substrate having a cell area and an extension area, a word line stack disposed above the substrate, the word line stack including mold layers and word lines alternately stacked, vertical channel structures vertically penetrating the word line stack in the cell area, and a first extension through-via structure vertically penetrating the word line stack in the extension area. The first extension through-via structure may include a first via plug and a first via liner layer surrounding sidewalls of the first via plug. The first via liner layer may include first dents respectively disposed at the same levels horizontally as the word lines of the word line stack.

In some example embodiments of the disclosure provides a three-dimensional semiconductor device. The three-dimensional semiconductor device may include a word line stack disposed above a substrate having a cell area and an extension area, the word line stack including mold layers and word lines alternately stacked, the word line stack horizontally extending in the cell area and having a staircase structure in the extension area, and vertical channel structures, a word line cut structure, and a first through-via structure vertically penetrating the word line stack. The first through-via structure may include a first via plug and a first via liner layer surrounding sidewalls of the first via plug. First dents may be disposed on an inner sidewall of the first via liner layer.

In some example embodiments of the disclosure provides a three-dimensional semiconductor device. The three-dimensional semiconductor device may include a substrate having a cell area, a dummy area, and an extension area, a logic device layer disposed on the substrate and including a transistor and a via pad, a lower interlayer insulating layer on the logic device layer, a common source layer embedded in the lower interlayer insulating layer, a lower word line stack and a lower staircase insulating layer on the lower insulating layer, an upper word line stack on the lower word line stack, an upper staircase insulating layer on the lower staircase insulating layer, vertical channel structures and a word line cut structure vertically penetrating the lower word line stack and the upper word line stack to be connected with the common source layer in the cell area, a dummy vertical channel structure vertically penetrating the lower word line stack and the upper word line stack to be connected with the common source layer in the dummy area, and a first through-via structure vertically penetrating a portion of the lower word line stack to be electrically connected the via pad in the extension area. The first through-via structure may include a first via plug and a first via liner layer surrounding sidewalls of the first via plug. Inner sidewalls of the first via liner layer may include seams disposed at the same levels as the word lines of the word line stack. The seams may have a ring shape or a disk shape in a plan view.

In some example embodiments of the disclosure provides a method of forming a three-dimensional semiconductor device. The method may include forming a lower interlayer insulating layer above a substrate, forming a mold stack on the lower interlayer insulating layer, the mold stack including mold layers and sacrificial layers alternately stacked, forming an upper interlayer insulating layer on the mold stack, forming vertical channel structures vertically penetrating the upper interlayer insulating layer and the mold stack, forming through-via holes vertically penetrating the upper interlayer insulating layer and the mold stack, partially removing the sacrificial layers of the mold stack through the through-via holes to form first recesses, forming through-via structures including via liner layers and via plugs filling insides of the first recesses in the through-via holes, forming a word line cut trench vertically penetrating the upper interlayer insulating layer and the mold stack between the vertical channel structures, removing the sacrificial layers of the mold stack though the word line cut trench to form second recesses, forming word lines in the second recesses to form a word line stack, and forming a trench liner and a trench plug in the word line cut trench to form a word line cut structure.

In some example embodiments of the disclosure provides a method of forming a three-dimensional semiconductor device. The method may include forming a lower interlayer insulating layer having a common source layer on a substrate, the substrate having a cell area and an extension area, forming a mold stack including alternately stacked mold layers and sacrificial layers on the lower interlayer insulating layer, forming an upper interlayer insulating layer on the mold stack, forming vertical channel structures vertically penetrating the upper interlayer insulating layer and the mold stack to be connected with the common source layer in the cell area, forming through-via holes vertically penetrating the upper interlayer insulating layer and the mold stack in the extension layer, partially removing the sacrificial layers of the mold stack through the through-via holes to form first recesses, forming via liner layers and via plugs surrounded by the via liner layers in the through-via holes to form through-via structures, outer side surfaces of the via liner layers including protruding portions protruding toward the sacrificial layers, forming a word line cut trench vertically penetrating the upper interlayer insulating layer and the mold stack between the vertical channel structures, removing the sacrificial layers of the mold stack through the word line cut trench to form second recesses, forming word lines in the second recesses to form a word line stack, and forming a trench liner and a trench plug in the word line cut trench to form a word line cut structure.

In some example embodiments of the disclosure provides a method of forming a three-dimensional semiconductor device. The method may include forming a logic device layer having via pads on a substrate having a cell area and an extension area, forming a lower interlayer insulating layer having a common source layer on the logic device layer, forming a mold stack having alternately stacked mold layers and sacrificial layers on the lower interlayer insulating layer, forming an upper interlayer insulating layer on the mold stack, forming vertical channel structures vertically penetrating the upper interlayer insulating layer and the mold stack layer to be electrically connected with the common source layer, forming through-via holes vertically penetrating the upper interlayer insulating layer, the mold stack, and the lower interlayer insulating layer to expose upper surfaces of the via pads, partially removing the sacrificial layers of the mold stack through the through-via holes to form first recesses, forming via liner layers and via plugs filling insides of the first recesses to form through-via structures respectively electrically connected with the via pads, forming a word line cut trench vertically penetrating the upper interlayer insulating layer and the mold stack between the vertical channel structures to expose upper surfaces of the common source layer, removing the sacrificial layers of the mold stack through the word line cut trench to form second recesses, forming word lines in the second recesses to form a word line stack, and forming a trench liner layer and a trench plug in the word line cut trench to form a word line cut structure electrically connected with the common source layer.

BRIEF DESCRIPTION OF THE DRAWINGS

FIGS. 2A to 2G are longitudinal cross-sectional views schematically illustrating three-dimensional semiconductor devices according to embodiments of the present disclosure.

FIGS. 19A to 19C are views illustrating a method of forming a three-dimensional semiconductor device according to some example embodiments of the present disclosure.

DETAILED DESCRIPTION OF EXAMPLE EMBODIMENTS

Figure 1A:
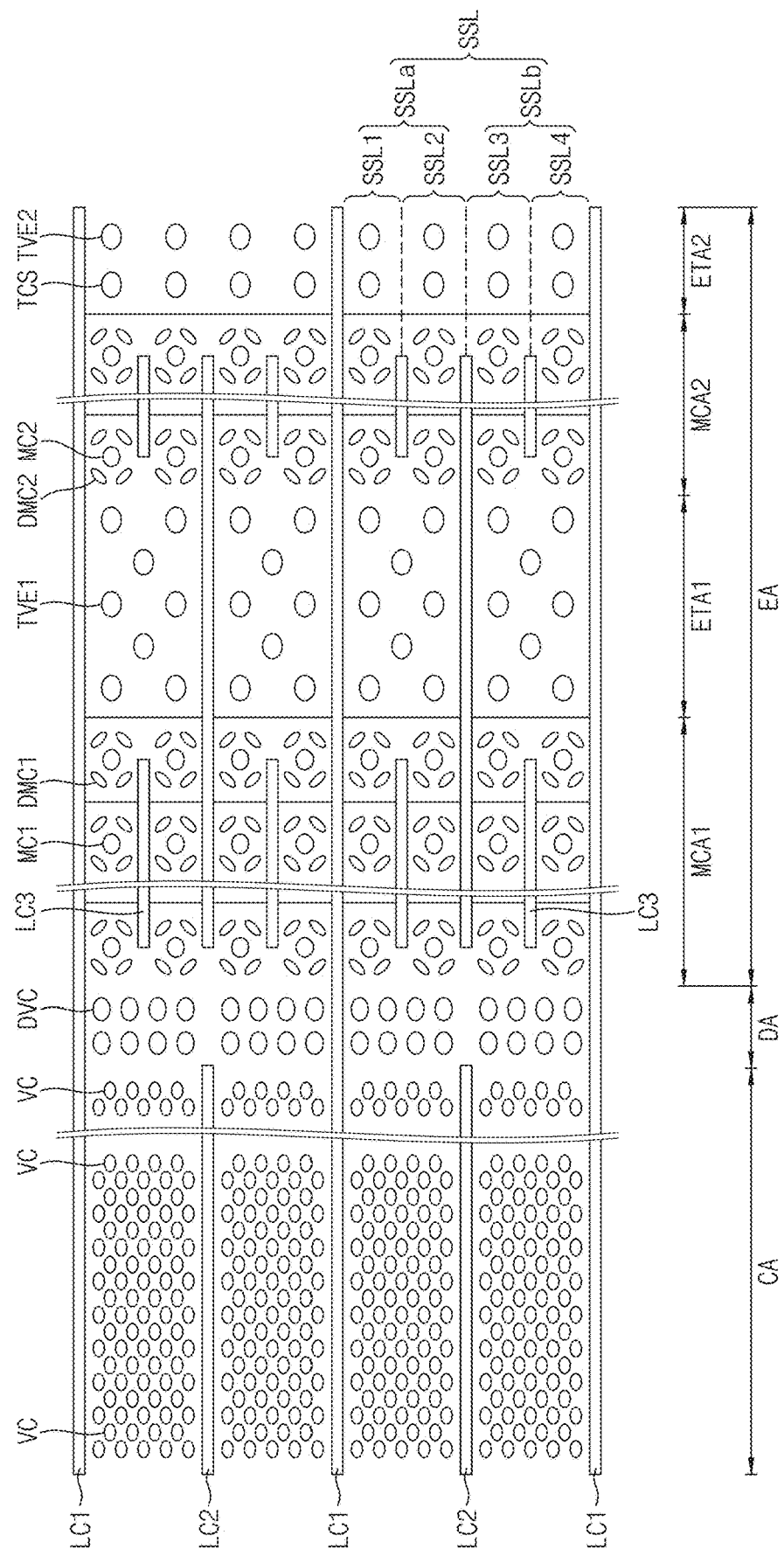
FIGS. 1A to 1D are schematic layouts of three-dimensional semiconductor devices according to various embodiments of the present disclosure.

FIGS. 1A to 1D are schematic layouts of three-dimensional semiconductor devices according to various example embodiments of the present disclosure. Referring to FIG. 1A, a three-dimensional semiconductor device according to some example embodiments of the present disclosure may include a cell area CA, a dummy area DA, and an extension area EA. The dummy area DA may be disposed between the cell area CA and the extension area EA.

A plurality of vertical channel structures VC may be disposed in the cell area CA. A plurality of dummy vertical channel structures DVC may be disposed in the dummy area DA. The extended area EA may include a first word line contact area MCA1, a second word line contact area MCA2, a first extension through-via area ETA, and a second extension through-via area ECA.

First word line contacts MC1 and first dummy contacts DMC1 may be disposed in the first word line contact area MCA1. Four first dummy contacts DMC1 may surround one first word line contact MC1. Second word line contacts MC2 and second dummy contacts DMC2 may be disposed in the second word line contact area MCA2. Four second dummy contacts DMC2 may surround one second word line contact MC2. The first and second dummy contacts DMC1 and DMC2 may have an elliptical shape.

The first extension through-via area ETA1 may be disposed between the first word line contact area MCA1 and the second word line contact area MCA2. First extension through-via structures TVE1 may be disposed in the first extension through-via area ETA1. For example, the first extension through-via structures TVE1 may be arranged in a zigzag form in a row direction and a column direction, respectively, although other arrangements may be used.

The second extension through-via area ETA2 may be disposed on a side of the second word line contact area MCA2. For example, the second word line contact area MCA2 may be disposed between the first extension through-via area ETA1 and the second extension through-via area ETA2. Second extension through-via structures TVE2 and common source vias TCS may be disposed in the second extension through-via area ETA2.

The word line cut structures LC1, LC2, and LC3 may be arranged to extend in parallel in the row direction. The word line cut structures LC1, LC2, and LC3 may include first word line cut structures LC1, second word line cut structures LC2, and third word line cut structures LC3. A pair of first word line cut structures LC1 may define one main string select line SSL.

The second word line cut structures LC2 may be disposed in a center between the two first word line cut structures LC1, respectively. The second word line cut structure LC2 may separate one of the main string select lines SSL into a first string select line pair SSLa and a second string select line pair SSLb. The second word line cut structures LC2 may have a plurality of long segment shapes extending in parallel in the column direction on the same line. The main string select lines SSL may be independently electrically activated, respectively. For example, the main string select lines SSL may be electrically insulated from each other.

The third word line cut structures LC3 may be disposed in the center between the two second word line cut structures LC2, respectively. The third word line cut structures LC3 may separate the first string select line pair SSLa into a first substring select line SSL1 and a second substring select line SSL2, and the second string selection line pair SSLb into a third substring selection line SSL3 and a fourth substring selection line SSL4. The third word line cut structures LC3 may have a plurality of short segment forms extending in parallel in the column direction on the same line, respectively.

The first to fourth sub string select lines SSL1 to SSL4 may be electrically connected with each other. For example, the first to fourth sub string select lines SSL1 to SSL4 may form one main string select line SSL, and may be electrically enabled and disabled at the same time. In some example embodiments, the second word line cut structures LC2 and/or the third word line cut structures LC3 may be a string select line cut structure.

Figure 1B:
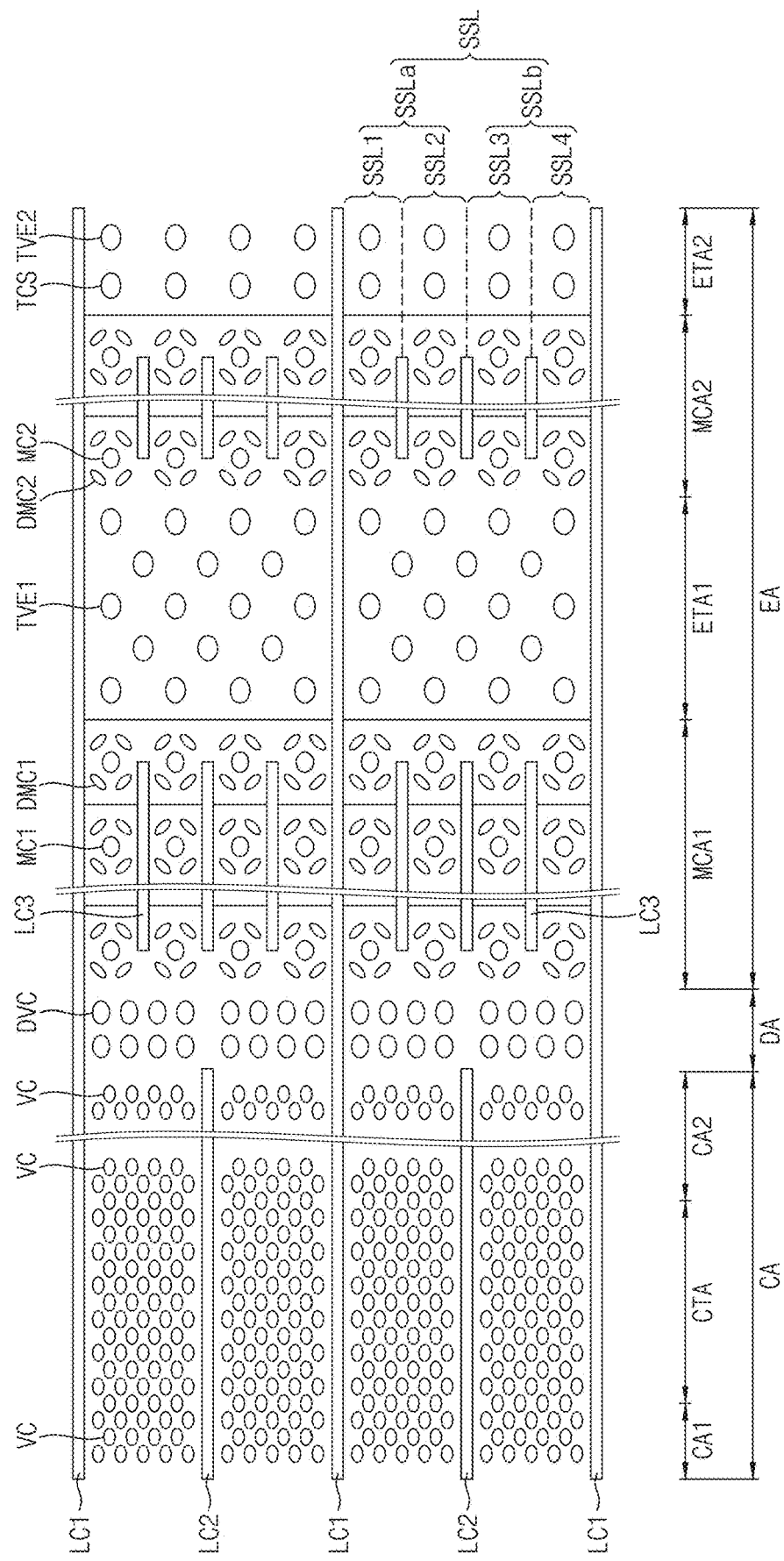

Referring to FIG. 1B, a three-dimensional semiconductor device according to some example embodiments of the present disclosure may include second word line cut structures LC2 having short segment structures in the extension area EA, compared to the three-dimensional semiconductor device illustrated in FIG. 1A. For example, the second word line cut structures LC2 may not extend between the first extension through-via structures TVE1. Additional first extension through-via structures TVE1 may be further formed between positions where the second word line cut structures LC2 are omitted, for example, between the second word line cut structures LC2.

Figure 1C:
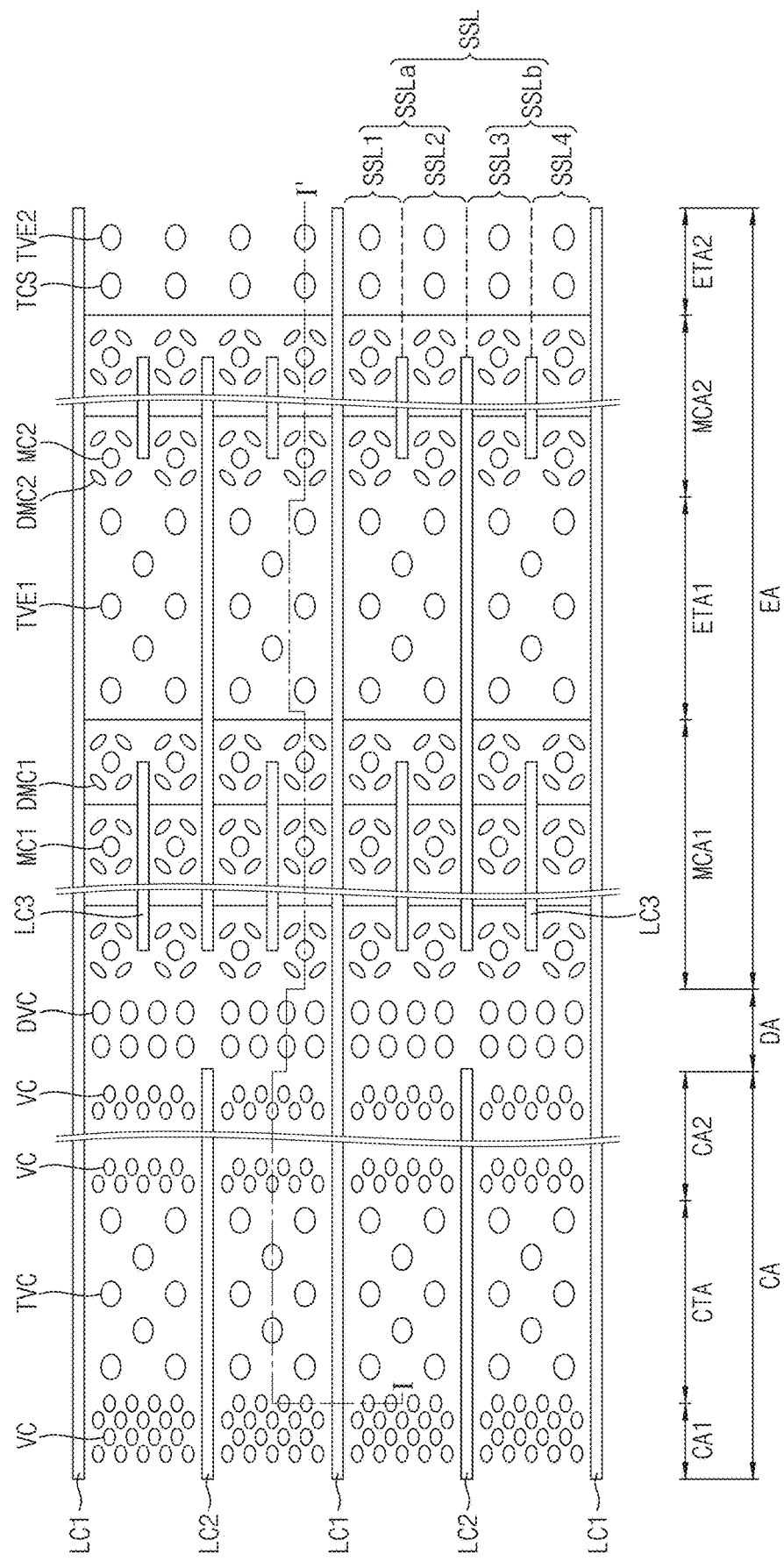

Referring to FIG. 1C, a three-dimensional semiconductor device according to some example embodiments of the present disclosure may include a cell area CA, a dummy area DA, and an extension area EA. Compared to the three-dimensional semiconductor device illustrated in FIG. 1A, the cell area CA may include a first cell area CA1, a second cell area CA2, and a cell through-via area CTA. The cell through-via area CTA may be disposed between the first cell area CA1 and the second cell area CA2. The second cell area CA2 may be disposed adjacent to the extension area EA. A plurality of vertical channel structures VC may be disposed in the first cell area CA1 and the second cell area CA2. A plurality of cell through-via structures TVC may be disposed in the cell through-via area CTA. The other elements may be understood with reference to FIG. 1A.

Figure 1D:
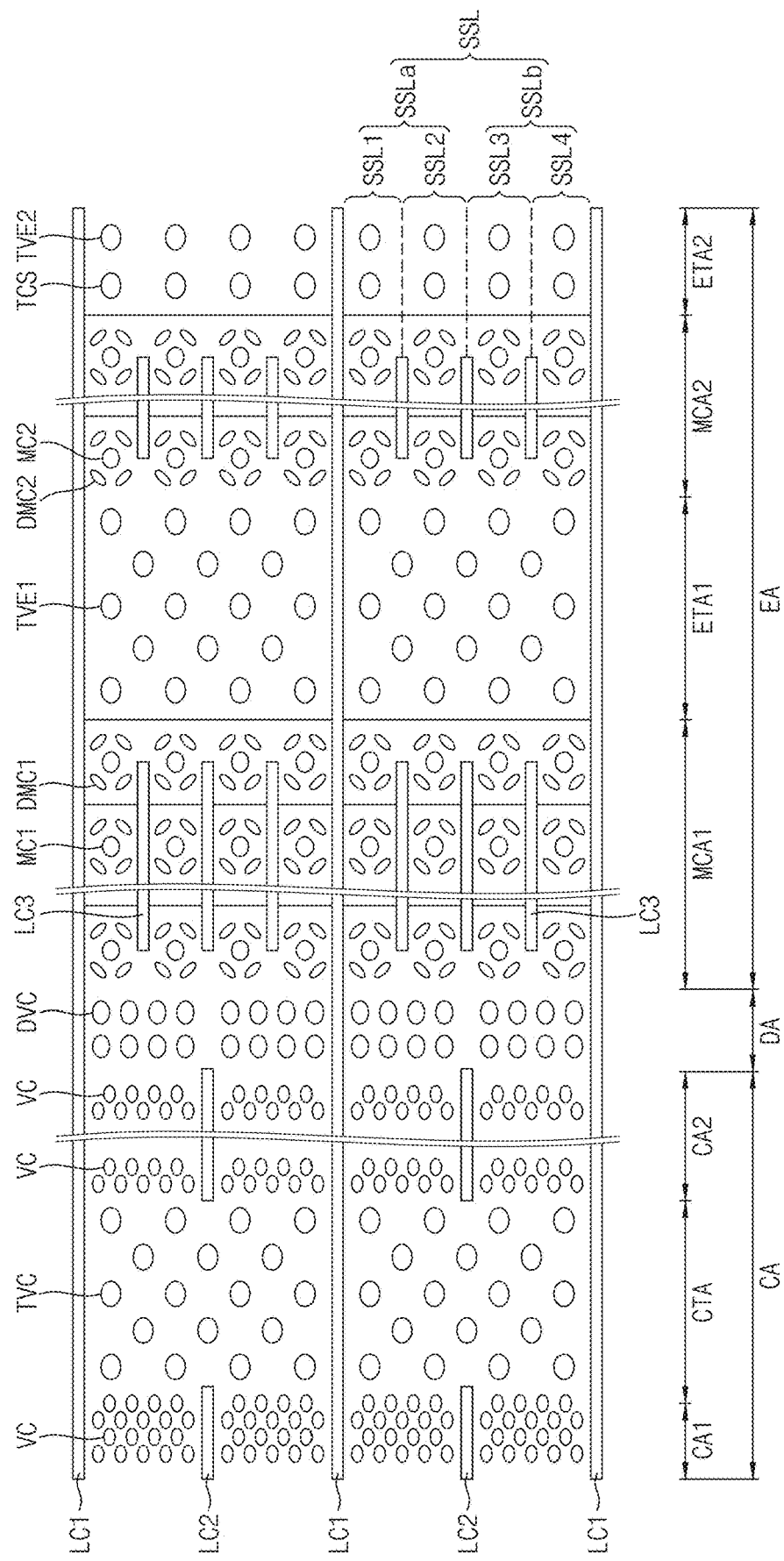

Referring to FIG. 1D, further referring to FIGS. 1B and 1C, the three-dimensional semiconductor device according to some example embodiments of the present disclosure may include second word line cut structures LC2 having short segment structures in the cell area CA. For example, the second word line cut structures LC2 may not extend between the cell through-via structures TVC in the cell through-via area CTA. Additional cell through-via structures TVC may be further formed at positions where the second word line cut structures LC2 are omitted. The other elements and a more detailed description will be understood with reference to FIGS. 1A to 1C.

Figure 2A:
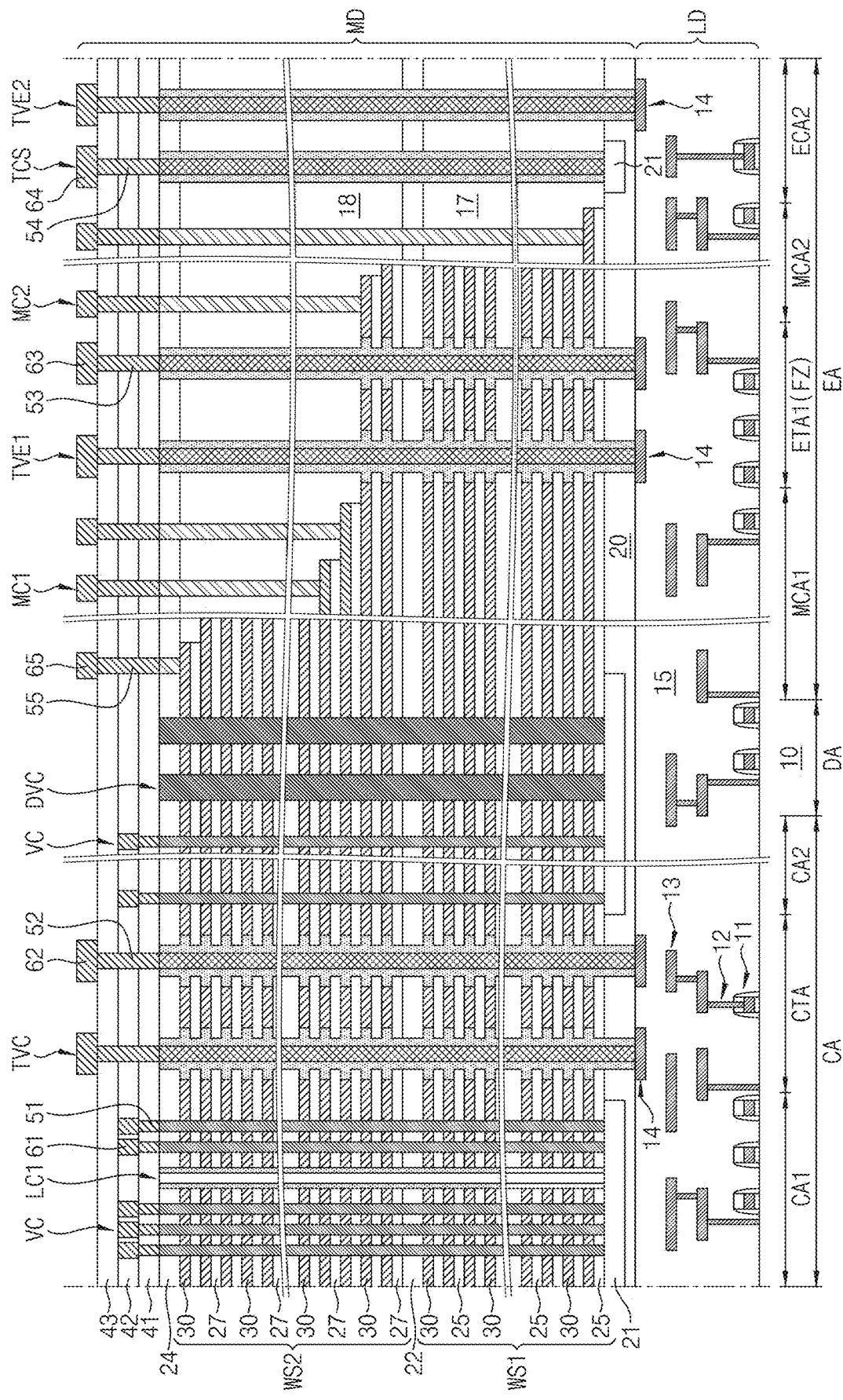
Figure 2C:
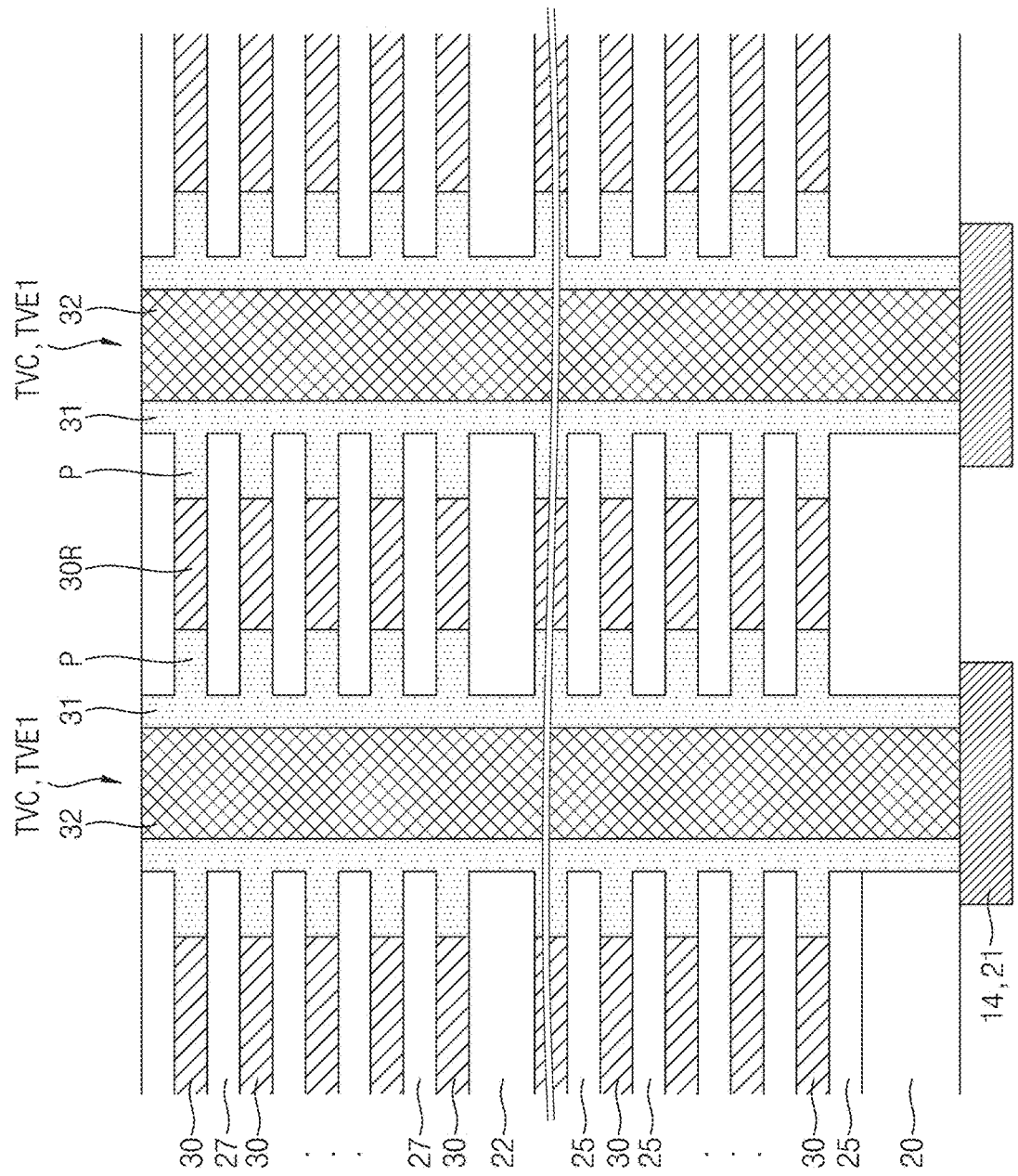

FIGS. 2A to 2G are longitudinal cross-sectional views schematically illustrating three-dimensional semiconductor devices according to embodiments of the present disclosure. For example, FIG. 2A is a longitudinal cross-sectional view taken along line I-I' of FIG. 1C. FIGS. 2B and 2C are enlarged views of a part of the three-dimensional semiconductor device shown in FIG. 2A.

Referring to FIG. 2A, the three-dimensional semiconductor device according to some example embodiments of the present disclosure may include a logic device layer LD and a memory device layer MD disposed on a substrate 10.

The logic device layer LD may include a plurality of transistors 11 disposed on the substrate 10, a plurality of logic vias 12, a plurality of logic conductors 13, a plurality of via pads 14, and a logic interlayer insulating layer 15.

The substrate 10 may include a semiconducting layer such as silicon (Si), silicon germanium (SiGe), silicon carbon (SiC), an epitaxial growth layer, and/or a silicon-on-insulator (SOI).

The transistors 11 may include a gate insulating layer, a gate electrode, a gate capping layer, and a gate spacer formed on the substrate 10. Reference numerals of the gate insulating layer, the gate electrode, the gate capping layer, and the gate spacer have been omitted to avoid complicated drawing. In addition, the transistors 11 may include source regions, drain regions, and channel regions formed in the substrate 10. The source regions, the drain regions, and the channel regions are not shown in order to avoid complicated drawing.

The logic vias 12 may include conductive via patterns having a pillar shape extending a vertical direction, and the logic conductors 13 may include a plurality of conductor patterns having a line shape extending in a horizontal direction.

The via pads 14 may include a plurality of conductive patterns exposed onto the logic interlayer insulating layer 15. The via pads 14 may have a pad shape, mesa shape, and/or a line shape. The gate electrode, the logic vias 12, the logic conductors 13, and the via pads 14 of the transistor 11 may include a conductor, and the gate insulating layer, the gate capping layer, and the gate spacers of the transistor 11, and the logic interlayer insulating layer 15 may include an insulator.

The logic interlayer insulating layer 15 may cover the transistors 11 on the substrate 10, the logic vias 12, and the logic conductors 13. The logic interlayer insulating layer 15 may cover side surfaces and lower surfaces of the via pads 14.

The memory device layer MD may include a common source layer 21 in a lower interlayer insulating layer 20, a lower word line stack WS1 and a lower staircase insulating layer 17, a middle interlayer insulating layer 22, an upper word line stack WS2 and upper staircase insulating layer 18, an upper interlayer insulating layer 24, vertical channel structures VC, cell through-via structures TVC, dummy vertical channel structures DVC, first and second extension through-via structures TVE1 and TVE2, a common source via TCS, and first and second word line contacts MC1 and MC2. The memory device layer MD may further include capping layers 41 to 43, vertical conductors 51 to 55, and horizontal conductors 61 to 65.

The lower interlayer insulating layer 20, the middle interlayer insulating layer 22, and the upper interlayer insulating layer 24 may include an insulator such as silicon oxide. In some example embodiments, the lower interlayer insulating layer 20 may include multiple insulating layers including silicon oxide, silicon nitride, silicon oxynitride, silicon carbide, and/or other insulators.

The common source layer 21 may include a conductor. For example, the common source layer 21 may include N-doped polysilicon, metal silicides, metal compounds, and/or metals. The common source layer 21 may be embedded in the lower interlayer insulating layer 20.

The lower word line stack WS1 may include lower mold layers 25 and word lines 30 alternately stacked to extend horizontally, and the upper word line stack WS2 may include upper mold layers 27 and word lines 30 alternately stacked to extend horizontally. The lower mold layers 25 and the upper mold layers 27 may include a silicon oxide based insulator. The word lines 30 may include a conductor. For example, the word lines 30 may include a word line barrier layer and a word line electrode. The word line barrier layer may include both an insulating barrier layer and a conductive barrier layer. The insulating barrier layer may include an insulator having a higher work function than silicon oxide, such as aluminum oxide ($Al_2O_3$), and the conductive barrier layer may include a diffusion barrier material, such as titanium nitride. The word line electrode may include a metal such as tungsten. The lower word line stack WS1 and the upper word line stack WS2 may have a staircase structure in the extension area EA. In the extension area (EA), the staircase structure of the lower word line stack WS1 may be covered by the lower staircase insulating layer 17, and the staircase structure of the upper word line stack WS2 may be covered by the upper staircase insulating layer 18. As referred to herein, the "staircase structure" of the word lines, or other features as disclosed, will be understood to refer to a structure and/or portion of a structure (e.g., a word line stack WS1) of elements (e.g., lower mold layers 25 and word lines 30) having different dimensions (e.g., lengths) in one or more directions that are perpendicular or substantially perpendicular to the "vertical direction" and wherein elements of the structure have lengths in the one or more directions that vary in inverse proportion with distance in the vertical direction from the bottom surface of the substrate 10 (e.g., word lines 30 that are distal from the bottom surface of the substrate 10 have smaller lengths than word lines 30 that are proximate to the bottom surface of the substrate 10). As a result, and as shown in at least FIG. 2A, a height of the staircase structure in the vertical direction is staggered in a perpendicular direction.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

The vertical channel structures VC may vertically penetrate the lower word line stack WS1 and the upper word line stack WS2 in the first cell area CA1 and the second cell area CA2 in the cell area CA. The vertical channel structures VC may be vertically aligned with the common source layer 21 in the lower interlayer insulating layer 20. Lower ends of the vertical channel structures VC may be electrically connected to the common source layer 21 in the lower interlayer insulating layer 20. Vertical channel structures VC may include an inner pillar and a memory layer. The memory layer may include a blocking barrier layer, a charge trap layer, a tunneling insulating layer, and a channel layer. The channel layer may cover outer side surfaces of the inner pillar, the tunneling insulating layer may cover outer side surfaces of the channel layer, the charge trap layer may cover outer side surfaces of the tunneling insulating layer, and the blocking barrier layer may cover outer side surfaces of the charge trap layer. The inner pillar may have a pillar shape. The channel layer, the tunneling insulation layer, and the charge trap layer may have a cylindrical shape. The blocking barrier layer may have multiple rings shape spaced apart (e.g., isolated from direct contact with each other) and stacked.

The cell through-via structures TVC may vertically penetrate the lower word line stack WS1 and the upper word line stack WS2 in the cell through-via area CTA in the cell area CA. The cell through-via structures TVC may vertically penetrate the middle interlayer insulating layer 22 and the lower interlayer insulating layer 20 to be electrically connected with via pads 14 of the logic device layer LD. The cell through-via structures TVC may be sufficiently insulated from the lower word line stack WS1 and the upper word line stack WS2.

With further reference to FIG. 2B, each cell through-via structures TVC may include a via liner layer 31 and a via plug 32. For example, the via liner layer 31 may include a silicon oxide based insulator, and the via plug 32 may include a conductor such as N-doped silicon, a metal silicide, a metal, and/or a metal compound. The via plug 32 may have a pillar shape. The via liner layer 31 may have a cylinder shape surrounding the via plug 32. The via liner layer 31 may include protruding portions P protruding horizontally from the outer side surface toward the word lines 30 between the mold layers 25 and 27. The protruding portions P may be disposed at the same horizontal level as the word lines 30, respectively. The via liner layer 31 may further include dents D on inner side surfaces formed to correspond to the protruding portions P, that is, the point or tip of the dents D may be at substantially the same level as a center of a corresponding portion P, or at another position at the same level of the corresponding portion P. The dents D may have a ring shape or a disk shape in a plan view. Accordingly, the dents D may be in the form of a seam shape like a ring shape at the same level, and the seams may have a ring shape or disk shape in the plan view. A portion 30R of the word lines 30 may remain between the protruding portions P of the neighboring cell through-via structures TVC. Referring to FIG. 2C, in some example embodiments, via liner layer 31 may include the protruding portions P, but may not include dents D of FIG. 2B. The second extension through-via structures TVE2 may have flat sidewalls. For example, the via liner layer 31 of the second extension through-via structures TVE2 may have an inner wall and an outer wall that are vertically flat. The via liner layer 31 of second extension through-via structures TVE2 may not have dents D and protruding portions P. In some example embodiments, the second extension through-via structures TVE2 may have dents D at selected protruding portions P, for example, alternating protruding portions P, or on only one of the inner walls of the second extension through-via structures TVE2.

The dummy vertical channel structures DVC may be disposed in the dummy area DA between the cell area CA and the extension area EA. The dummy vertical channel structures DVC may have a structure substantially the same as the vertical channel structures VC. For example, the dummy vertical channel structures DVC may include an inner pillar and a memory layer. The dummy vertical channel structures DVC may vertically penetrate the upper interlayer insulating layer 24, the upper word line stack WS2, the middle interlayer insulating layer 22, and the lower word line stack WS1 to be connected with the common source layer 21 in the lower interlayer insulating layer 20. The dummy vertical channel structures DVC may have a greater diameter than the vertical channel structures VC in a top view.

The first extension through-via structures TVE1 may selectively vertically penetrate the upper interlayer insulating layer 24, the upper staircase insulating layer 18, the upper word line stack WS2, the middle interlayer insulating layer 22, the lower word line stack WS1, the lower staircase insulating layer 17, and the lower interlayer insulating layer 20 in the first extension through-via area ETA1 in the extension area EA to be electrically connected with the via pads 14 in the logic device layer LD. The first through-via structures TVE1 may have a structure substantially the same as that of the cell through-via structures TVC. Accordingly, the first extension through-via structures TVE1 may have the structures described with reference to FIGS. 2B and 2C. The first through-via area ETA1 may have a flat zone FZ shaped like a staircase landing. In the flat zone FZ, the word line stacks WS1 and WS2 may have a shape extending horizontally without having a staircase. Accordingly, the first extension through-via structures TVE1 may be disposed within the flat zone FZ.

The second extension through-via structure TVE2 may vertically penetrate the upper interlayer insulating layer 24, the upper staircase insulating layer 18, the middle interlayer insulating layer 22, the lower staircase insulating layer 17, and the lower interlayer insulating layer 20 to be electrically connected with the via pad 14 in the logic device layer LD in the second extension through-via area ETA2 in the extension area EA. For example, the second extension through-via structure TVE2 may not penetrate the lower word line stack WS1 and the upper word line stack WS2.

The common source via TCS may vertically penetrate the upper interlayer insulating layer 24, the upper staircase insulating layer 18, the middle interlayer insulating layer 22, and the lower staircase insulating layer 17 to be electrically connected with the common source layer 21 in the lower interlayer insulating layer 20 in the second extension through-via area ETA2 in the extension area EA. For example, the common source via TCS may not penetrate the lower word line stack WS1 and the upper word line stack WS2.

The first and second word line contacts MC1 and MC2 may selectively vertically penetrate the upper interlayer insulating layer 24, the upper staircase insulating layer 18, the intermediate interlayer insulating layer 22, and the lower layer to be electrically connected with the word lines 30, respectively.

The first and second dummy contacts DMC1 and DMC2 shown in FIGS. 1A to 1D may be disposed in the extension area EA, and may have a structure substantially the same as that of the dummy vertical channel structure DVC. For example, the first and second dummy contacts DMC1 and DMC2 may selectively vertically penetrate the upper interlayer insulating layer 24, the upper staircase insulating layer 18, the upper word line stack WS2, the intermediate interlayer insulating layer 22, the lower word line stack WS1, and the lower staircase insulating layer 17.

The capping layers 41 to 43 may include a lower capping layer 41, a middle capping layer 42, and an upper capping layer 43. The vertical conductors 51-55 may include a vertical channel via plug 51, a cell through-via studs 52, an extension through-via studs 53, a common source via plugs 54, and a word line via plugs 55. The horizontal conductors 61-65 may include a bit line 61, a cell through-via connection conductor 62, an extension through-via connection conductor 63, a common source connection conductor 64, and a word line connection conductor 65. The vertical conductors 51-55 and the horizontal conductors 61-65 may optionally be omitted. The vertical conductors 51-55 and the horizontal conductors 61-65 may not be formed on the dummy vertical channel structure DVC. The capping layers 41-43 may include an insulating material such as silicon oxide. The vertical conductors 51-55 and the horizontal conductors 61-65 may include a conductive material such as a metal.

Figure 2D:
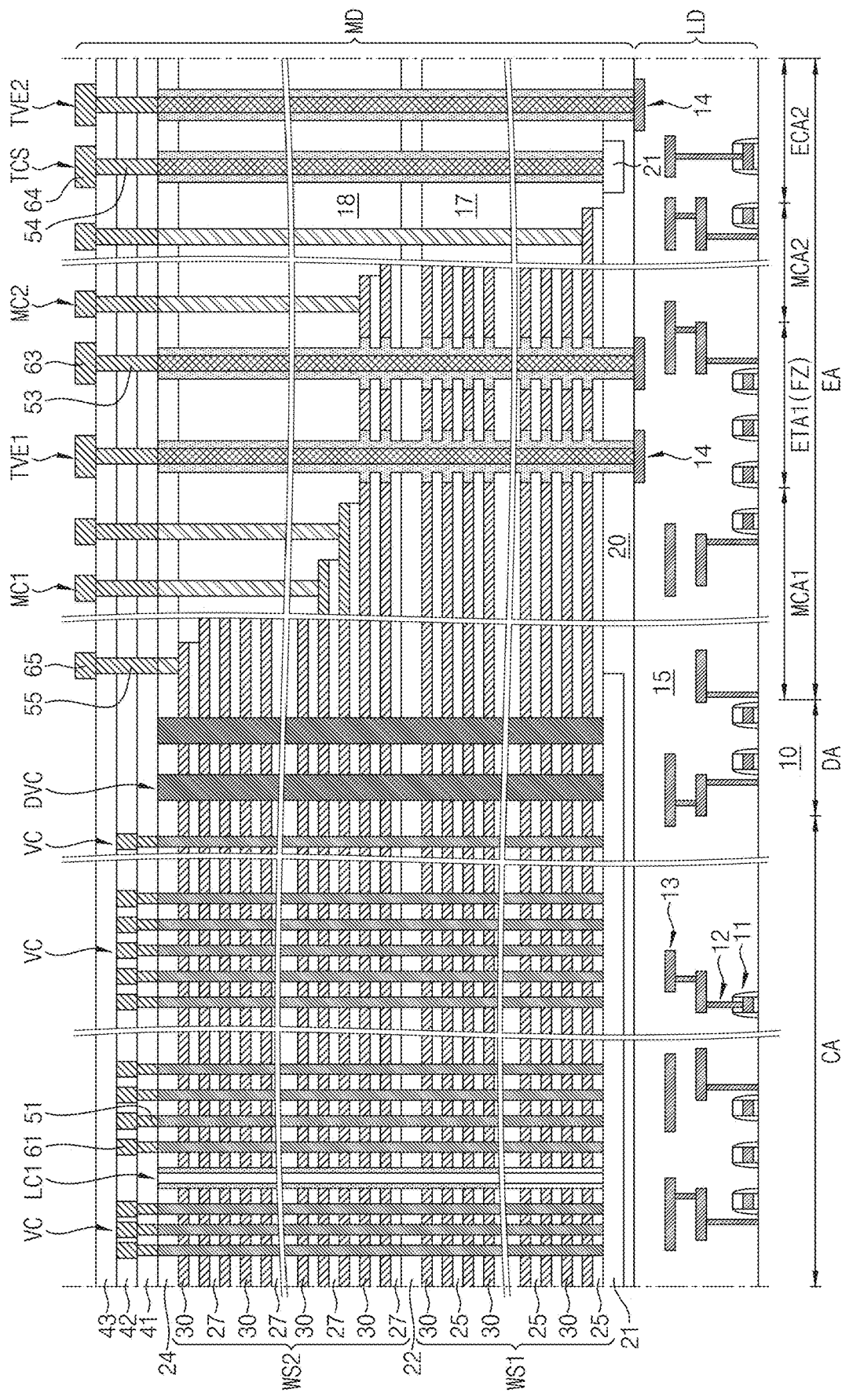

Referring to FIG. 2D, the three-dimensional semiconductor device according to some example embodiments of the present disclosure may not include the cell through-via structures TVC in the cell area CA, as compared with the three-dimensional semiconductor device illustrated in FIG. 2A. For example, the three-dimensional semiconductor device shown in FIG. 2D may have a layout or a top view shown in FIG. 1A or 1B.

Figure 2E:
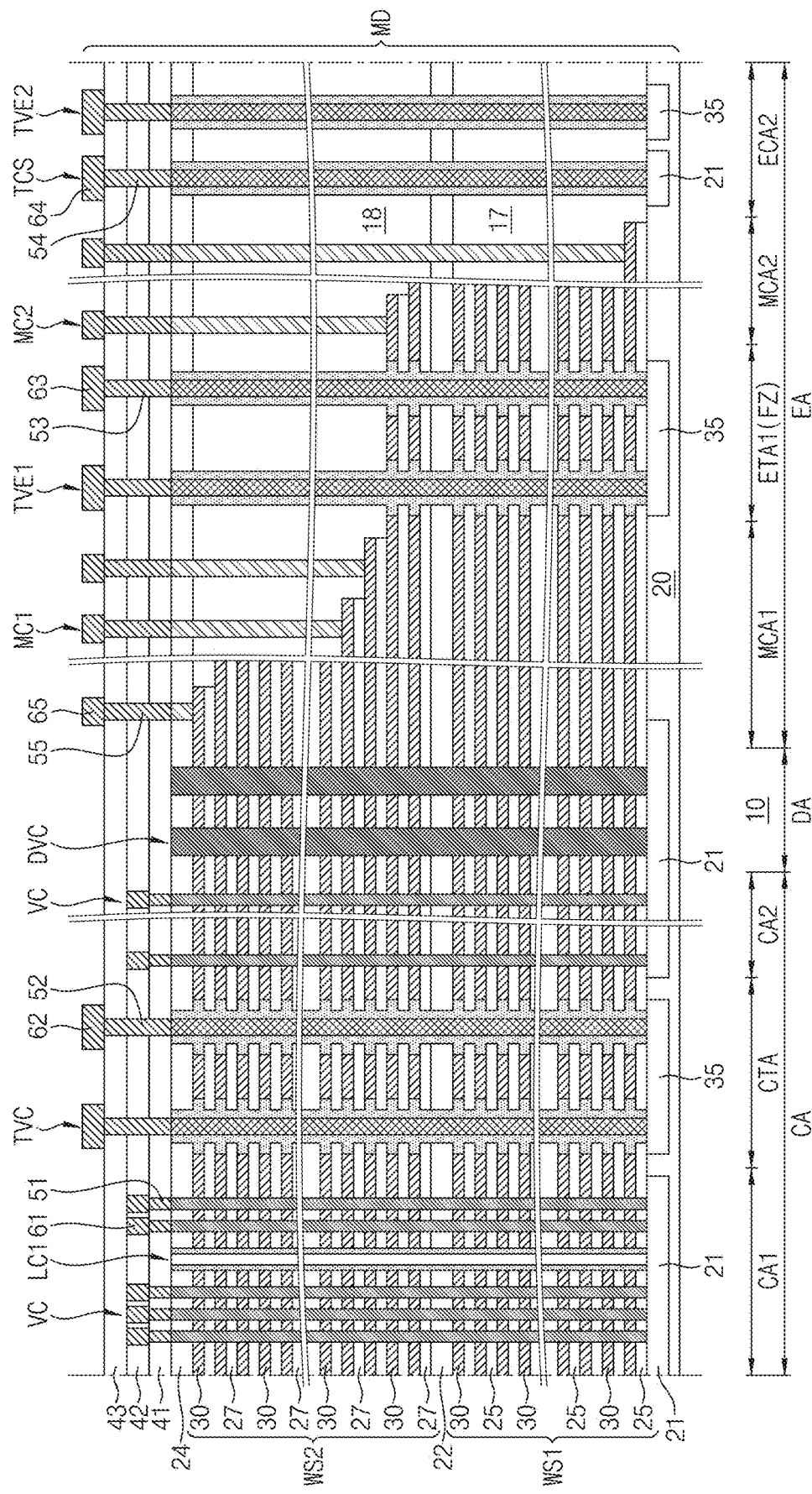

Referring to FIG. 2E, a three-dimensional semiconductor device according to some example embodiments of the present disclosure may include a lower interlayer insulating layer 20 on a substrate 10, a common source layer 21, a via conductor layer 35, a lower word line stack WS1 and a lower staircase insulating layer 17, a middle interlayer insulating layer 22, an upper word line stack WS2 and an upper staircase insulating layer 18, an upper interlayer insulating layer 24, vertical channel structures VC, cell through-via structures TVC, dummy vertical channel structures DVC, first and second extension through-via structures TVE1 and TVE2, common source via TCS, and first and second words line contacts MC1 and MC2. The memory device layer MD may further include capping layers 41 to 43, vertical conductors 51 to 55, and horizontal conductors 61 to 65. The via insulating layer 35 may include an N-doped polysilicon, a metal silicide, a metal compound, or a metal. The via insulating layer 35 may be embedded in the lower interlayer insulating layer 20.

The common source layer 21 and the via conductor layer 35 may be electrically insulated. The vertical channel structure VC, the dummy vertical channel structure DVC, and the common source via TCS may be electrically connected with the common source layer 21, and the via conductor layer 35 may be electrically connected with the cell through-via structure TVC and the extension through-via structures TVE1 and TVE2.

Figure 2G:
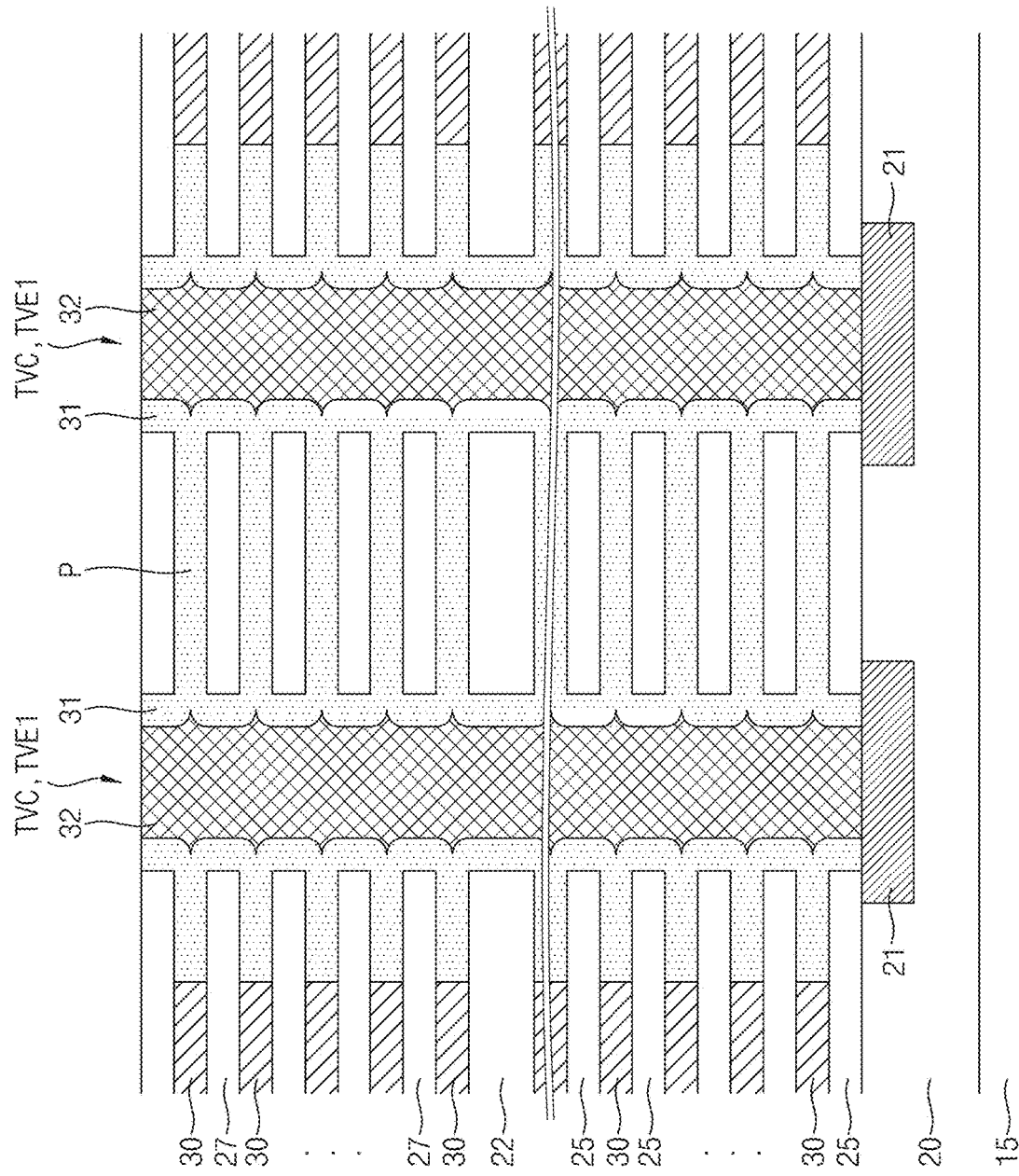

Referring to FIGS. 2F and 2G, the three-dimensional semiconductor device according to some example embodiments of the present disclosure may not include any word lines between the through-via structures TVC and TVE1 adjacent to each other as compared to the three-dimensional semiconductor device shown and described with reference to FIGS. 2A to 2C. For example, protruding portions P of the via liner layers 31 of the neighboring through-via structures TVC and TVE1 may be horizontally connected to each other.

Figure 3:
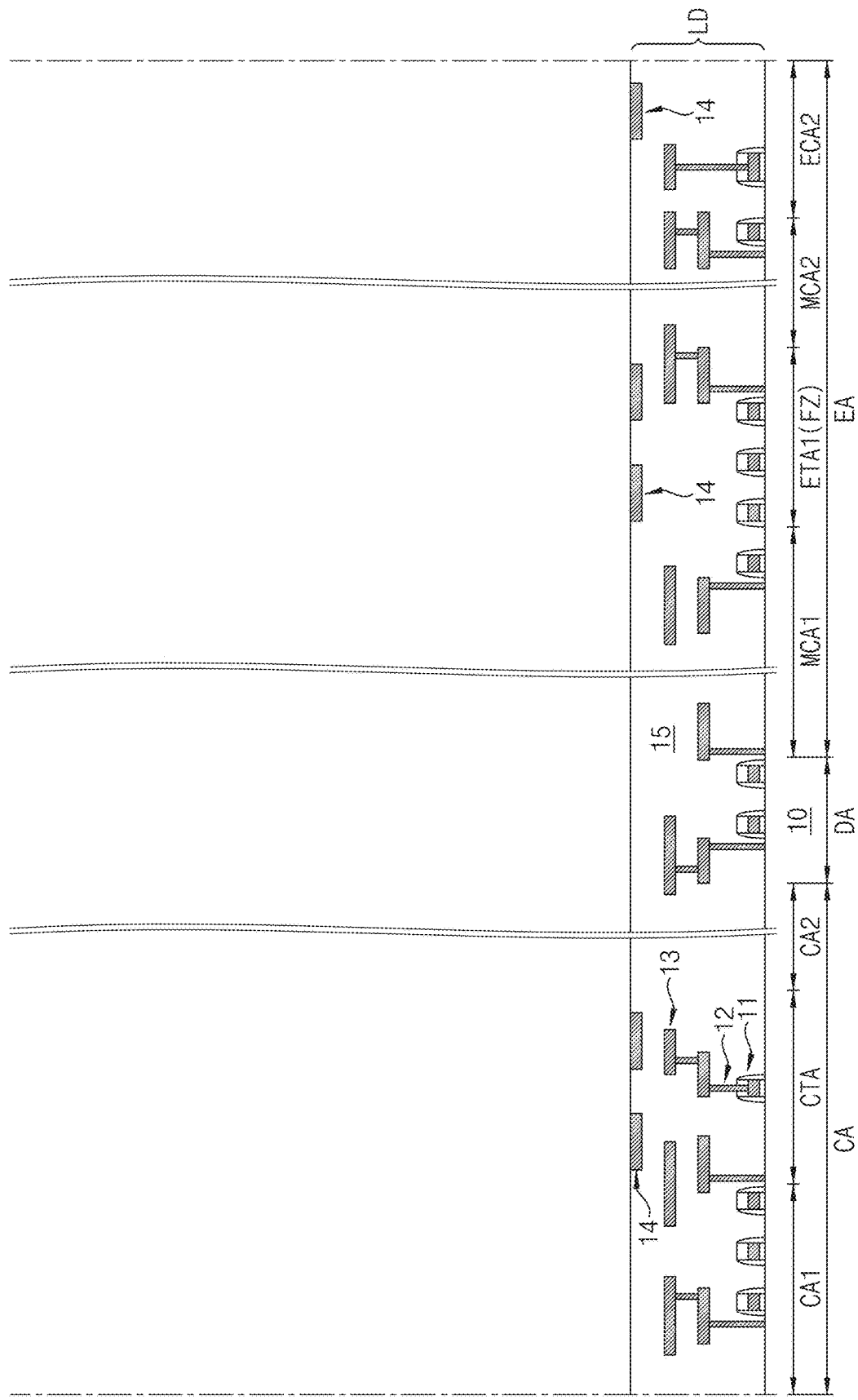
FIGS. 3 to 18 are diagrams illustrating a method of forming a three-dimensional memory device according to some example embodiments of the present disclosure.

FIGS. 3 to 18 are diagrams illustrating a method of forming a three-dimensional memory device according to some example embodiments of the present disclosure. Referring to FIG. 3, the method of forming the three-dimensional memory device may include forming a logic device layer LD on a substrate 10. The forming the logic device layer LD may include transistors 11, logic vias 12, logic conductors 13, via pads 14, and logic interlayer dielectric layer 15 on the substrate 10. The substrate 10 may include a semiconductor material layer such as silicon (Si), silicon germanium (SiGe), silicon carbon (SiC), an epitaxial growth layer, and/or a silicon-on-insulator (SOI). The forming the transistors 11 may include performing a deposition process, a photolithography process, and/or an etching process to form a gate insulating layer, a gate electrode, a gate capping layer, and a gate spacer on the substrate 10. Reference numerals of the gate insulating layer, the gate electrode, the gate capping layer, and the gate spacer have been omitted to avoid complications in the FIG. 3.

In addition, the forming the transistors 11 may include forming a source region, a drain region, and a channel region in the substrate 10 by performing an ion implant process. The source region, the drain region, and the channel region are not shown in order to avoid complications in the FIG. 3.

The forming the logic vias 12 may include performing a deposition process and a patterning process to form a plurality of conductive via patterns having a pillar shape that extend vertically, and the forming the logic conductors 13 may including performing a deposition process and a patterning process to form a plurality of conductor patterns having a line shape extending in a horizontal direction. The forming the via pads 14 may include performing a deposition process and a patterning process to form a plurality of conductor patterns exposed on the logic interlayer insulating layer 15.

Figure 4:
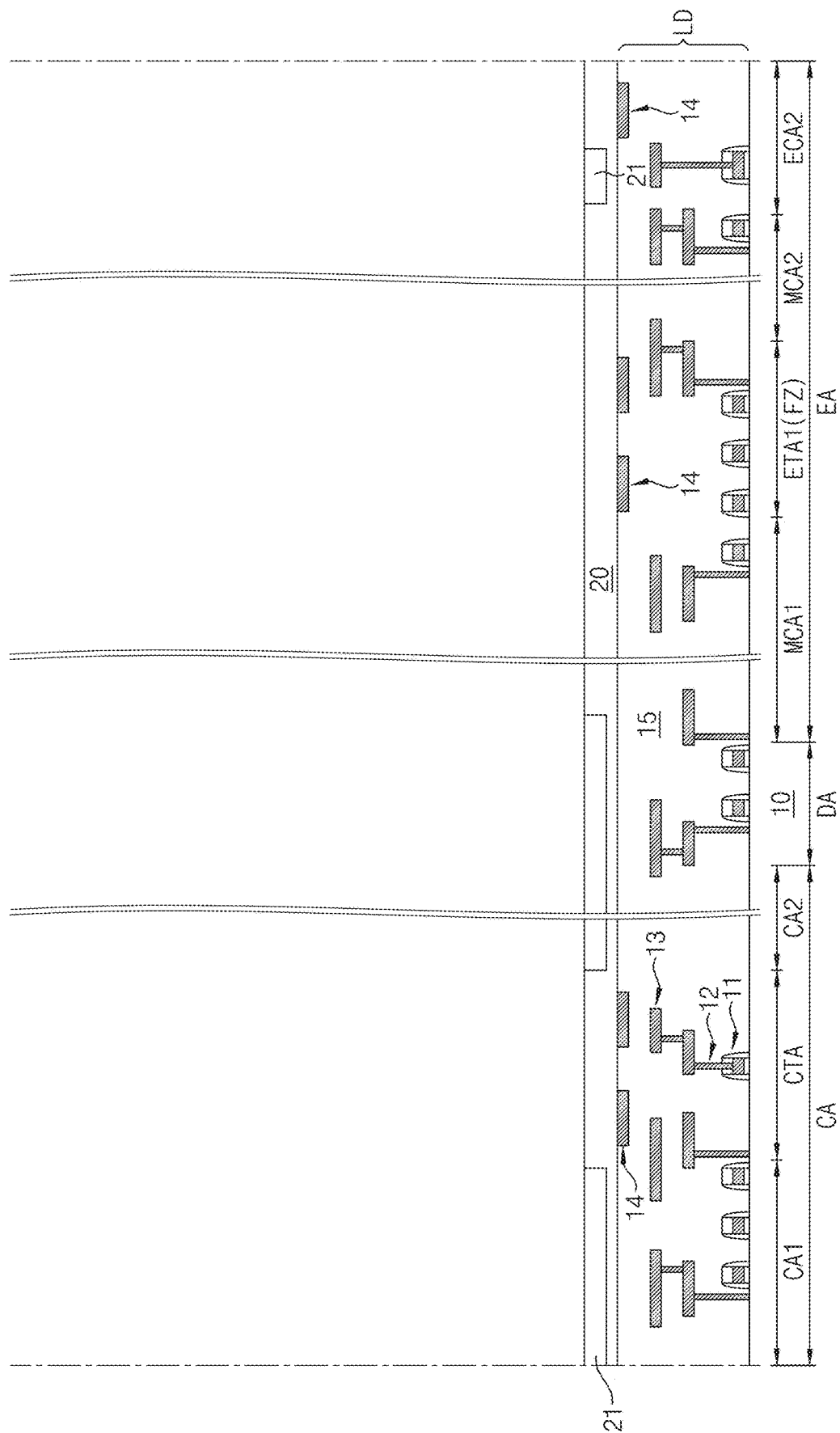

Referring to FIG. 4, the method may include forming a lower interlayer insulating layer 20 and a common source layer 21 on the logic device layer LD. The common source layer 21 may include a conductor in the form of a plate or a line. For example, the common source layer 21 may include a conductor such as N-doped silicon, metal, metal silicide, metal alloy, and/or metal compound. The N-doped silicon may be polysilicon doped with N-type impurities such as phosphorus (P), arsenic (As), and/or antimony (Sb). The lower interlayer insulating layer 20 may include silicon oxide-based materials such as SiOC, SiOH, and/or SiCHO. A top surface of the common source layer 21 may be exposed without being covered by the lower interlayer insulating layer 20.

Figure 5:
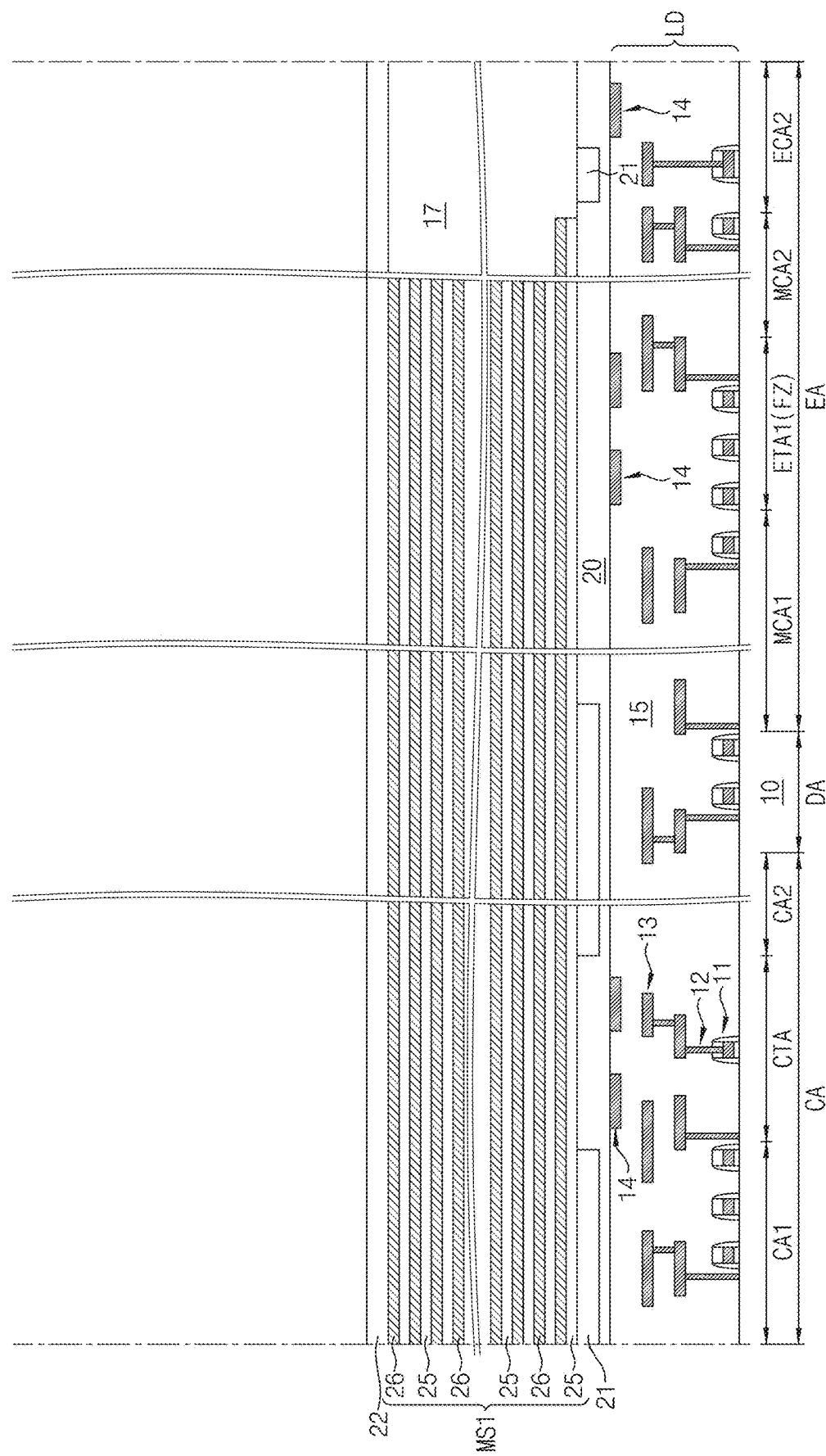

Referring to FIG. 5, the method may include forming a lower mold stack MS1, a lower staircase insulating layer 17, and a middle interlayer insulating layer 22 on the lower interlayer insulating layer 20 and the common source layer 21. The lower mold stack MS1 may include lower mold layers 25 and lower sacrificial layers 26 stacked alternately. The lower mold layers 25 and the lower sacrificial layers 26 may include different materials to have an etch selectivity. For example, the lower mold layers 25 may include silicon oxide, and the lower sacrificial layers 26 may include silicon nitride. In the extension area EA, the lower mold stack MS1 may have a staircase structure. In the second extension through-via area ETA2 of the extension area EA, the common source layer 21 may be exposed without being covered by the lower mold stack MS1. In the extended area EA, the staircase structure of the lower mold stack MS1 may be covered by the lower stepped insulating layer 17. The middle interlayer insulating layer 22 may be formed on the lower mold stack MS1 and the lower staircase insulating layer 17. The lower staircase insulating layer 17 and the middle interlayer insulating layer 22 may include silicon oxide.

Figure 6:
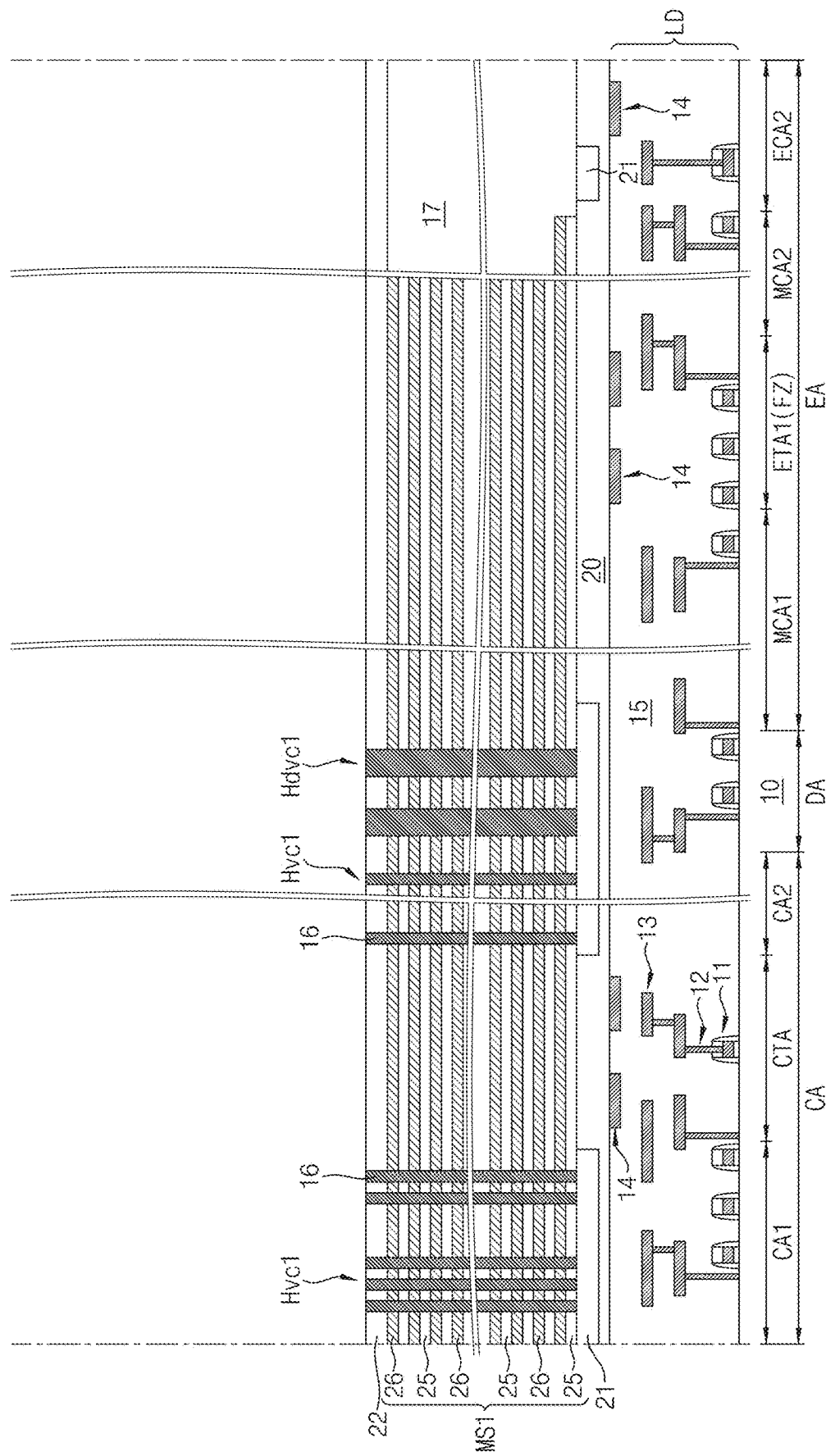

Referring to FIG. 6, the method may include forming lower vertical channel holes Hvc1 and lower dummy vertical channel holes Hdvc1, and filling insides of the lower vertical channel holes Hvc1 and the lower dummy vertical channel holes Hdvc1 with a sacrificial material. The lower vertical channel holes Hvc1 and the lower dummy vertical channel holes Hdvc1 may vertically penetrate the lower mold stack MS1 to expose an upper surface of the common source layer 21. The sacrificial material 16 in the lower vertical channel holes Hvc1 and the lower dummy vertical channel holes Hdvc1 may include spin-on-hardmask (SOH), polymeric organic material, polysilicon, silicon carbide (SiC), silicon germanium (SiGe), silicon oxide, and/or other material having an etch selectivity with respect to silicon nitride. In some example embodiments, the sacrificial material 16 in the lower vertical channel holes Hvc1 and the lower dummy vertical channel holes Hdvc1 may be a single layer or a double layer.

Figure 7:
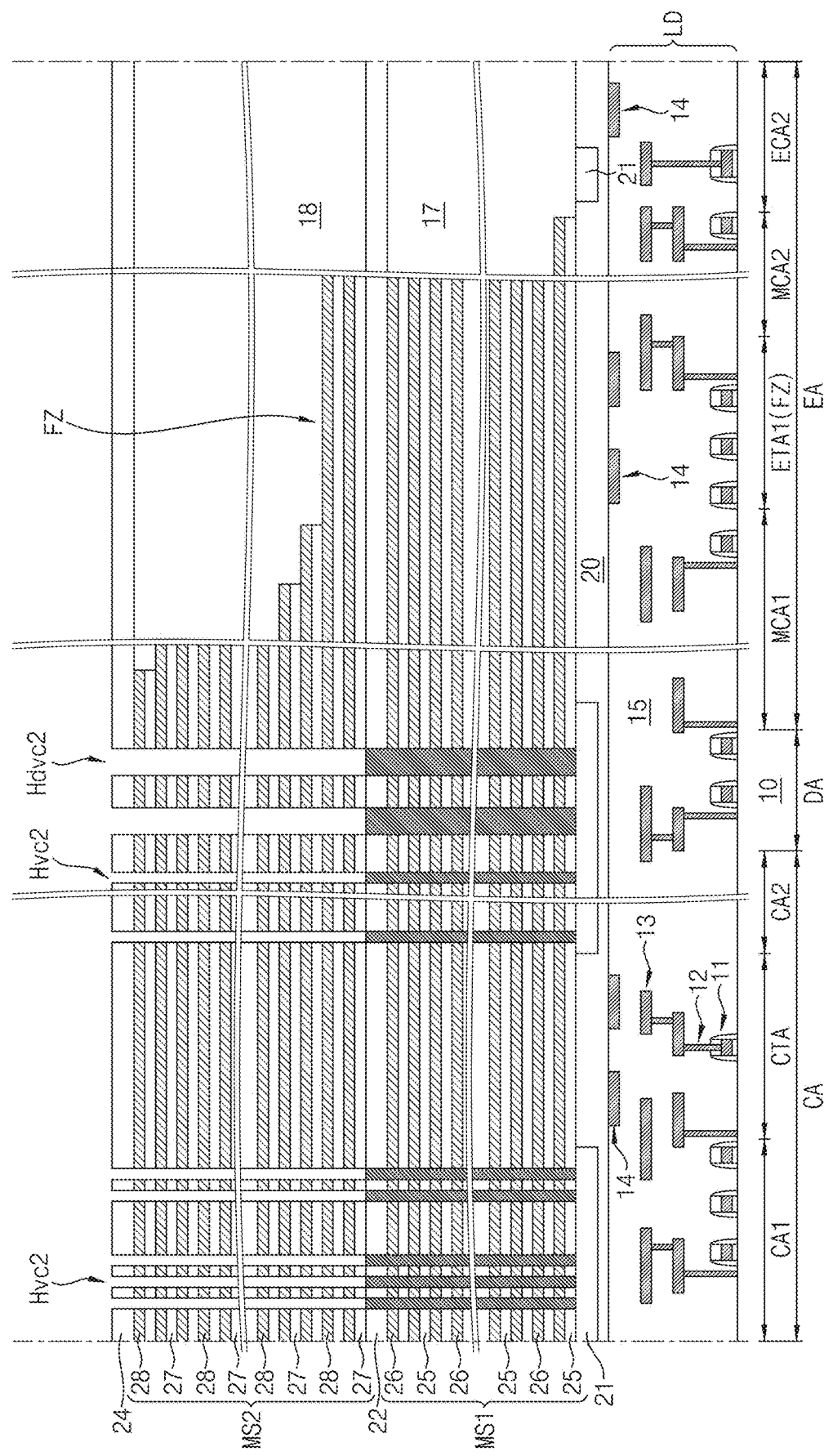

Referring to FIG. 7, the method may include forming an upper mold stack MS2, an upper staircase insulating layer 18, and an upper interlayer insulating layer 24 on the middle interlayer insulating layer 22, and forming upper vertical channel holes Hvc2 and the upper dummy vertical channel holes Hdvc2. The upper mold stack MS2 may include upper mold layers 27 and upper sacrificial layers 28 that are alternately stacked. The upper mold layers 27 may include silicon oxide, and the upper sacrificial layers 28 may include silicon nitride. In the extension area EA, the upper mold stack MS2 may have a staircase structure together with the lower mold stack MS1. In the extension area EA, the staircase structure of the upper mold stack MS2 may be covered by the upper staircase insulating layer 18. The upper interlayer insulating layer 24 may be formed on the upper mold stack MS2 and the upper staircase insulating layer 18. The upper staircase insulating layer 18 and the upper interlayer insulating layer 24 may include silicon oxide. The upper vertical channel holes Hvc2 and the upper dummy vertical channel holes Hdvc2 may vertically penetrate the upper mold stack MS2 to be aligned and connected with the lower vertical channel holes Hvc1 and the lower dummy vertical channel holes Hdvc1, respectively. In the extension area EA, the upper mold stack MS2 may have a flat zone FZ. The flat zone FZ may have a staircase landing shape. The flat zone FZ may overlap the first extension through-via area ETA1 in the extension area EA. In some example embodiments, the lower mold stack MS1 and the upper mold stack MS2 may independently have at least one or more flat zones FZ.

Figure 8:
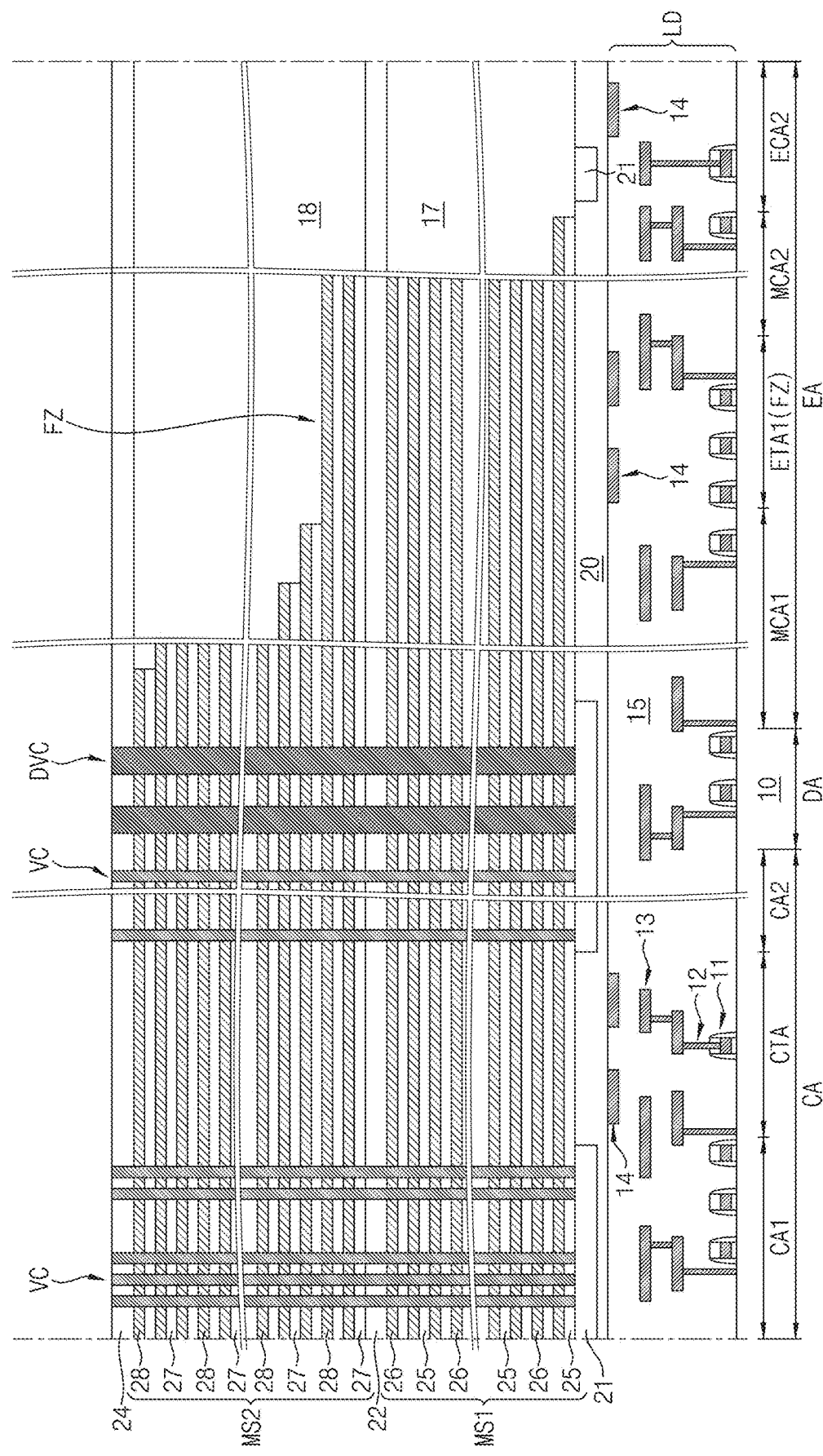

Referring to FIG. 8, the method may include removing the sacrificial material 16 in the lower vertical channel holes Hvc1 and the lower dummy vertical channel holes Hdvc1, and forming vertical channel structures VC and dummy vertical channel structures DVC. The forming the vertical channel structures VC and the dummy vertical channel structures DVC may include forming a memory layer in the lower vertical channel holes Hvc1, the upper vertical channel holes Hvc2, the lower dummy vertical channel holes Hdvc1, and the upper dummy vertical channel holes.

Figure 9:
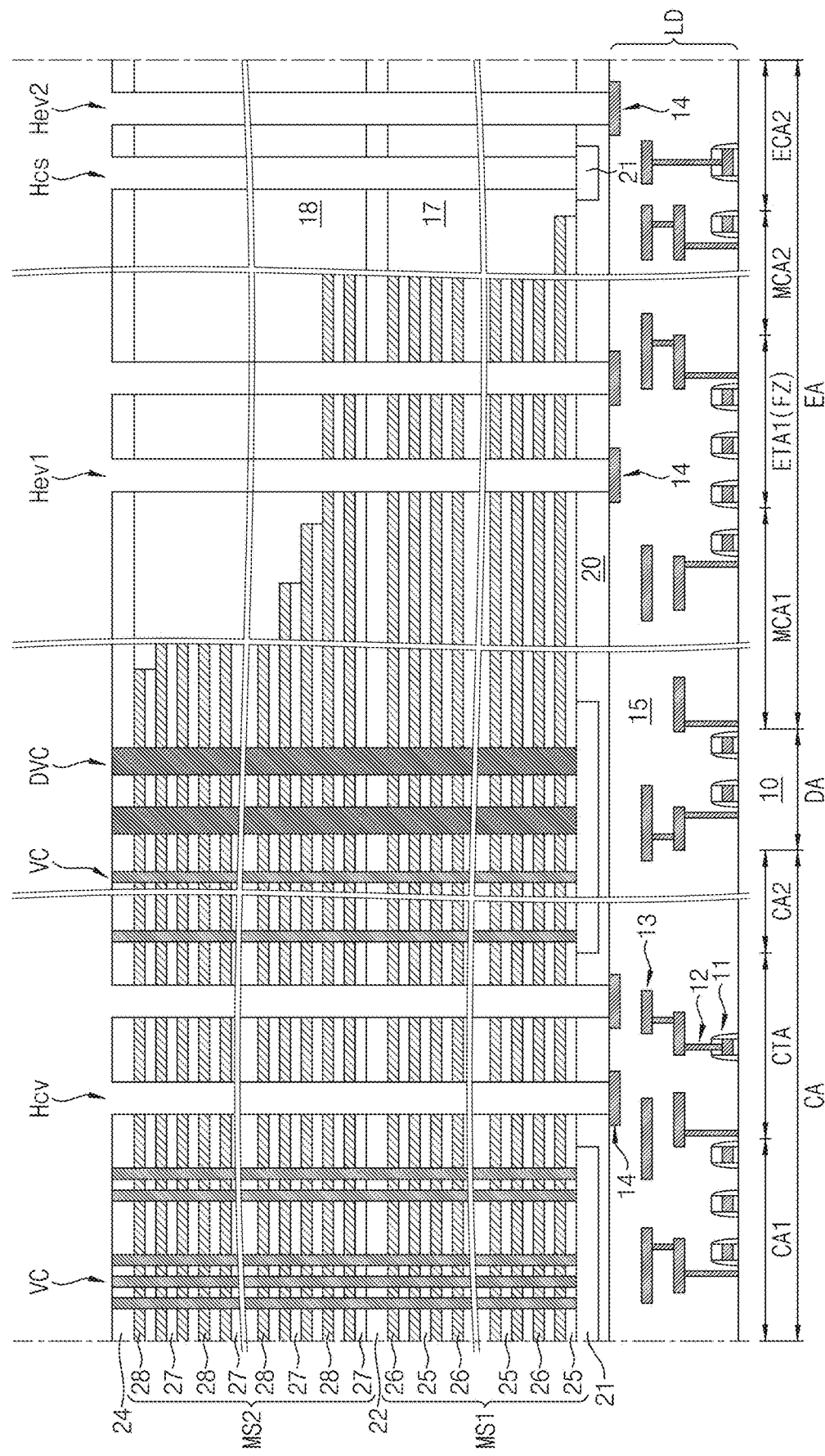

Referring to FIG. 9, the method may include forming a cell through-via hole Hcv, first and second extended through-via holes Hev1 and Hev2, and a common source via hole Hcs. The forming the cell through-via hole Hcv may include vertically penetrating the upper mold stack MS2 and the lower mold stack MS1 to expose an upper surface of the via pad 14. The forming the first extension through-via hole Hev1 may include selectively vertically penetrating the upper interlayer insulating layer 24, the upper staircase insulating layer 18, the upper mold stack MS2, the middle interlayer insulating layer 22, and the lower mold stack MS1 to expose an upper surface of the via pad 14 in the flat zone FZ. The forming the second extension through-via hole Hev2 may include vertically penetrate the upper interlayer insulating layer 24, the upper staircase insulating layer 18, the middle interlayer insulating layer 22, the lower staircase insulating layer 17, and the lower interlayer insulating layer 20 to expose an upper surface of the via pad 14. The forming the common source via hole Hcs may include vertically penetrating the upper interlayer insulating layer 24, the upper staircase insulating layer 18, the middle interlayer insulating layer 22, and the lower stair insulating layer 17 to expose un upper surface of the common source layer 21.

Figure 10A:
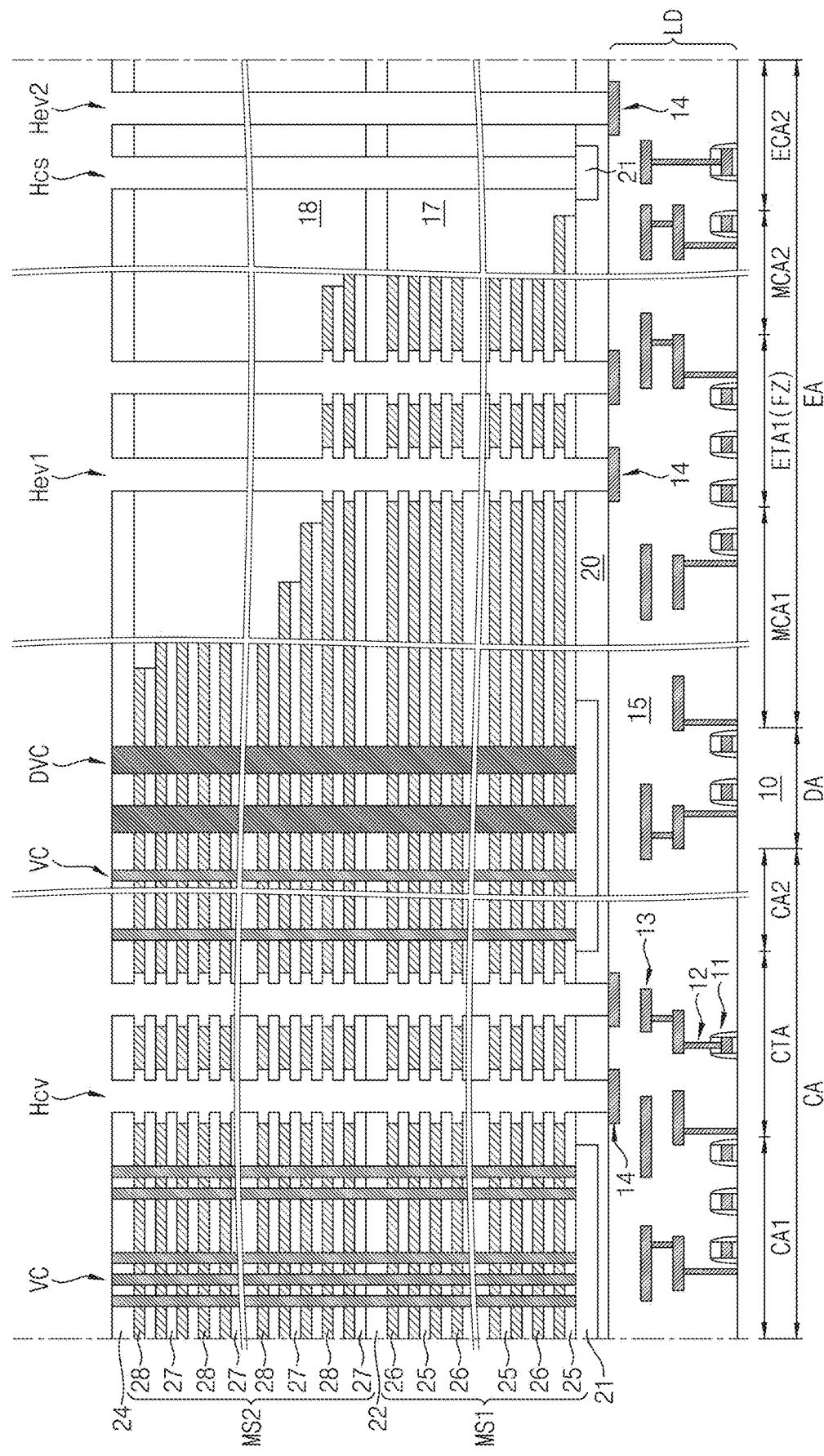

Referring to FIG. 10A, the method may include performing an expansion process to partially remove the upper sacrificial layers 28 and the lower sacrificial layer 26 exposed in the cell through-via hole Hcv, the dummy vertical channel hole Hdvc, and the first extension through-via hole Hev1. The expansion process may include a wet full-back etching process using phosphoric acid ($H_3PO_4$).

Figure 10B:
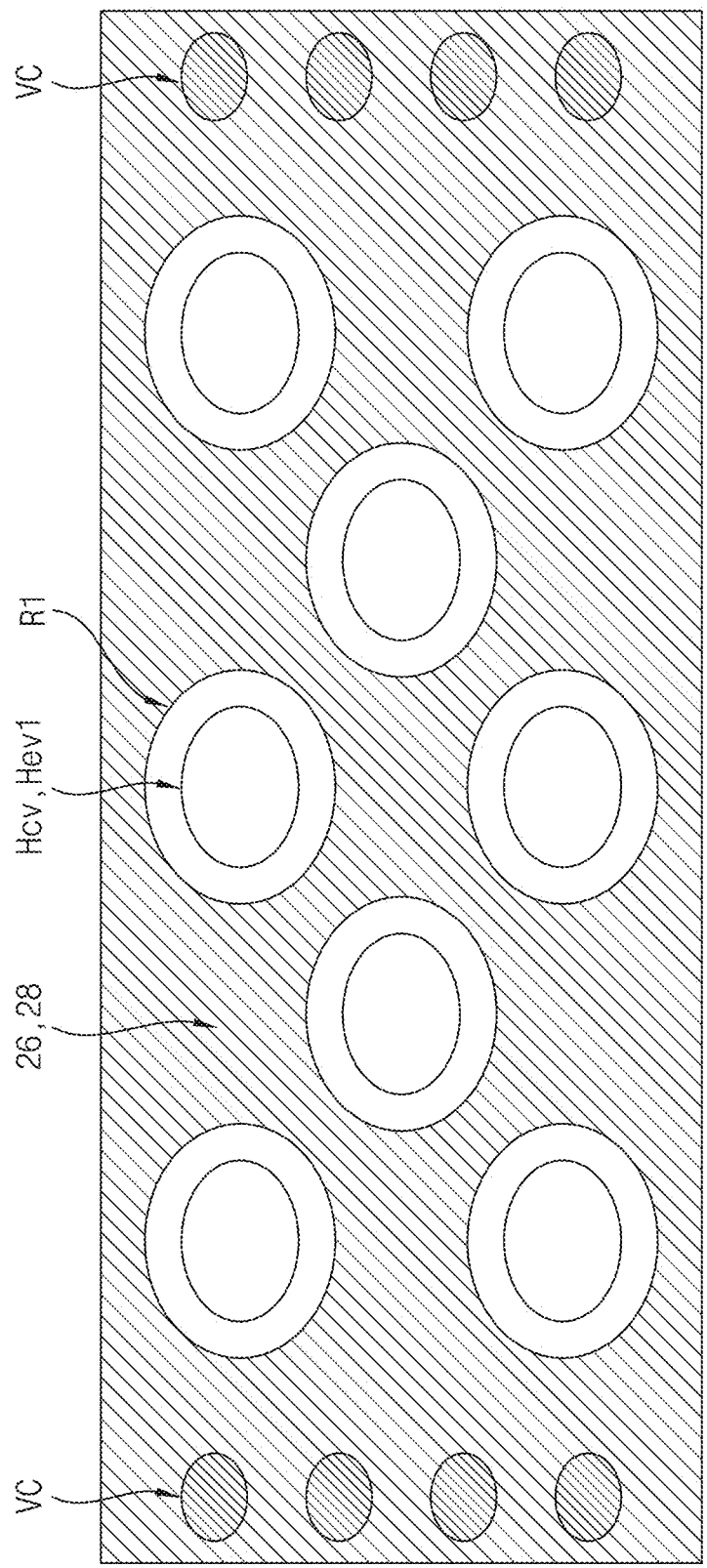

FIGS. 10B and 10C are schematic diagrams illustrating that the upper sacrificial layers 28 and the lower sacrificial layers 26 exposed in the cell through-via hole Hcv and the first extended through-via hole Hev1 are partially removed by the expansion process. FIG. 10B is a top view or a plan view, and FIG. 10C is a longitudinal sectional view. Referring to FIGS. 10B and 10C, the upper sacrificial layers 28 and the lower sacrificial layers 26 exposed in the cell through-via hole Hcv and the first extension through-via hole Hev1 may be removed in a circular shape or a ring shape by the expansion process. Thus, recesses R1 may be formed in a horizontal direction. The upper sacrificial layers 28 and lower sacrificial layers 26 may remain RM between neighboring cell through-via holes Hcv and between neighboring first extension through-via holes Hev1.

Figure 11A:
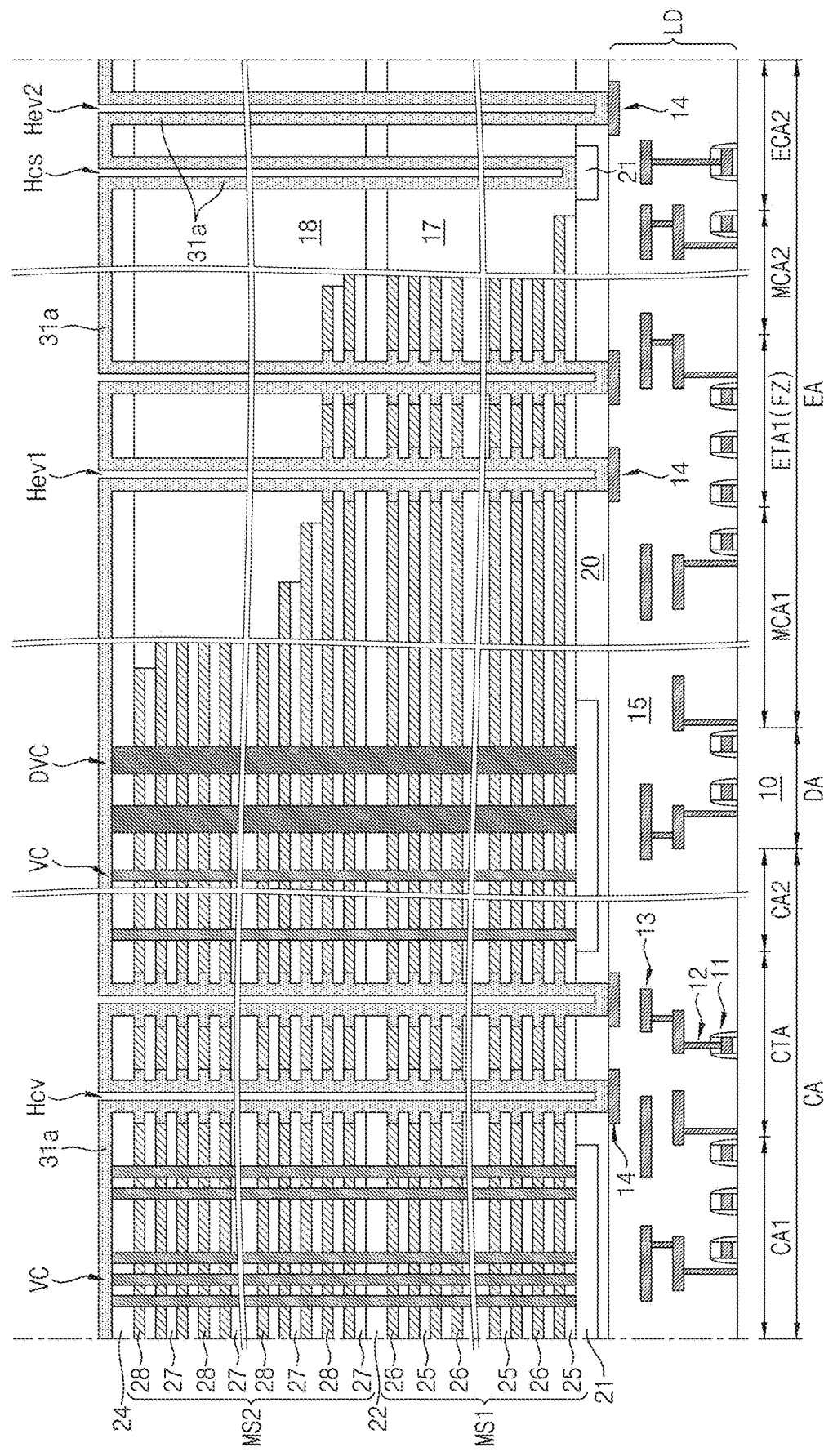

Referring to FIG. 11A, the method may include performing a deposition process to form a liner material layer 31a on inner sidewalls of the cell through-via holes Hcv, the first and second extension through-via holes Hev1 and Hev2, and the common source via holes Hcs. The via liner material layer 31a may fill insides of the recesses R1, and be conformably formed on inner sidewalls and bottom surfaces of the cell through-via hole Hcv, the first and second extension through-via holes Hev1 and Hev2, and the common source via hole Hcs, and on the upper interlayer insulating layer 24.

FIG. 11B is an enlarged partial view of FIG. 11A. Referring to FIG. 11B, the via liner material layer 31a may include dents D formed at positions horizontally aligned with the same level as the recesses R1. The via liner material layer 31a may include protruding protrusions P filling the recesses R1.

Figure 12A:
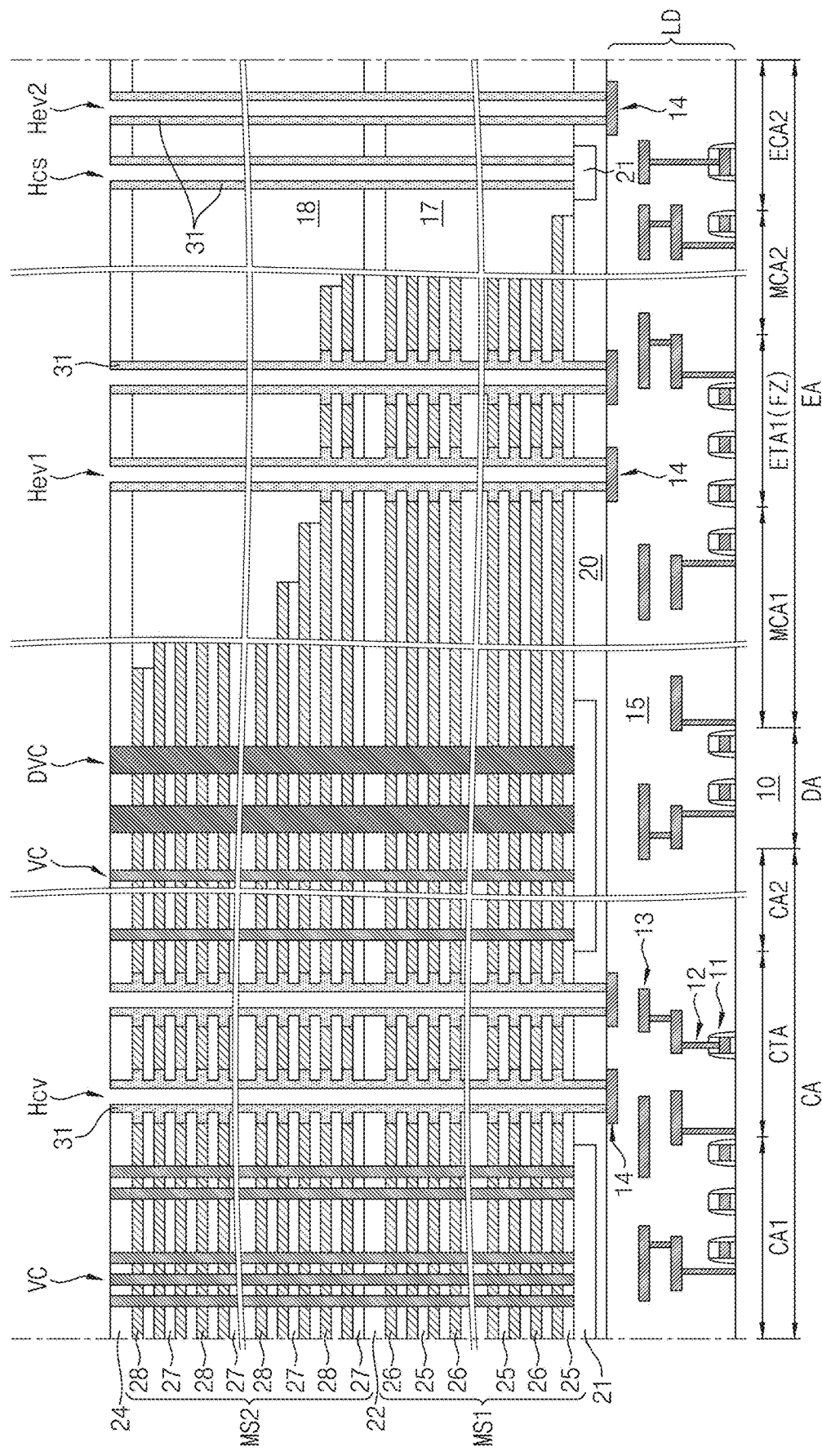

Referring to FIG. 12A, the method may include anisotropic etching the via liner material layer 31a to conformably form a via liner layer 31 on inner sidewalls of the cell through-via holes Hcv, the first and second extended through-via holes Hev1 and Hev2, and the common source via holes Hcs. Upper surfaces of the via pads 14 may be exposed. The via liner layer 31 may have protruding portions P filling the insides of the recesses R1, and conformally formed on inner walls of the cell through-via hole Hcv, the first and second extension through-via holes Hev1 and Hev2, and the common source via hole Hcs.

Figure 12B:
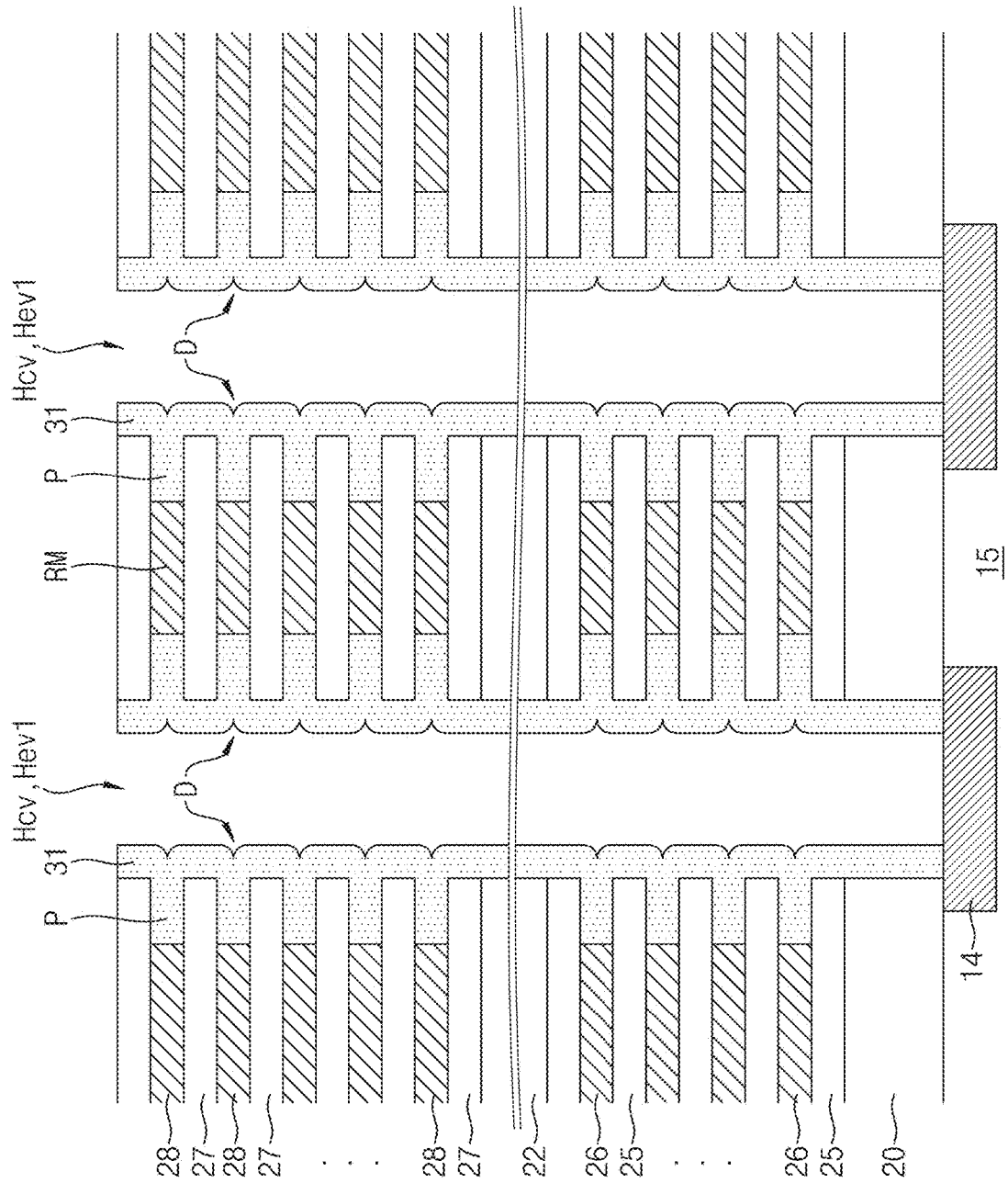

FIG. 12B is an enlarged partial view of FIG. 12A. Referring to FIG. 12B, the via liner layer 31 may include dents D formed at positions horizontally aligned with the recesses R1. Referring to 11b, the dents D may be maintained. As mentioned above, the dents D may be a ring or disk type seam shape in the top view. That is, the protruding portions P and the dents D may have a ring shape or a rim shape in a plan view or a horizontal cross-sectional view. A distance between the via plugs 32 and the word lines 30 may be greater than a distance between the via plugs 32 and the mold layers 25 and 27. Thus, the via plugs 32 and the word lines 30 may be more electrically insulated.

Figure 13A:
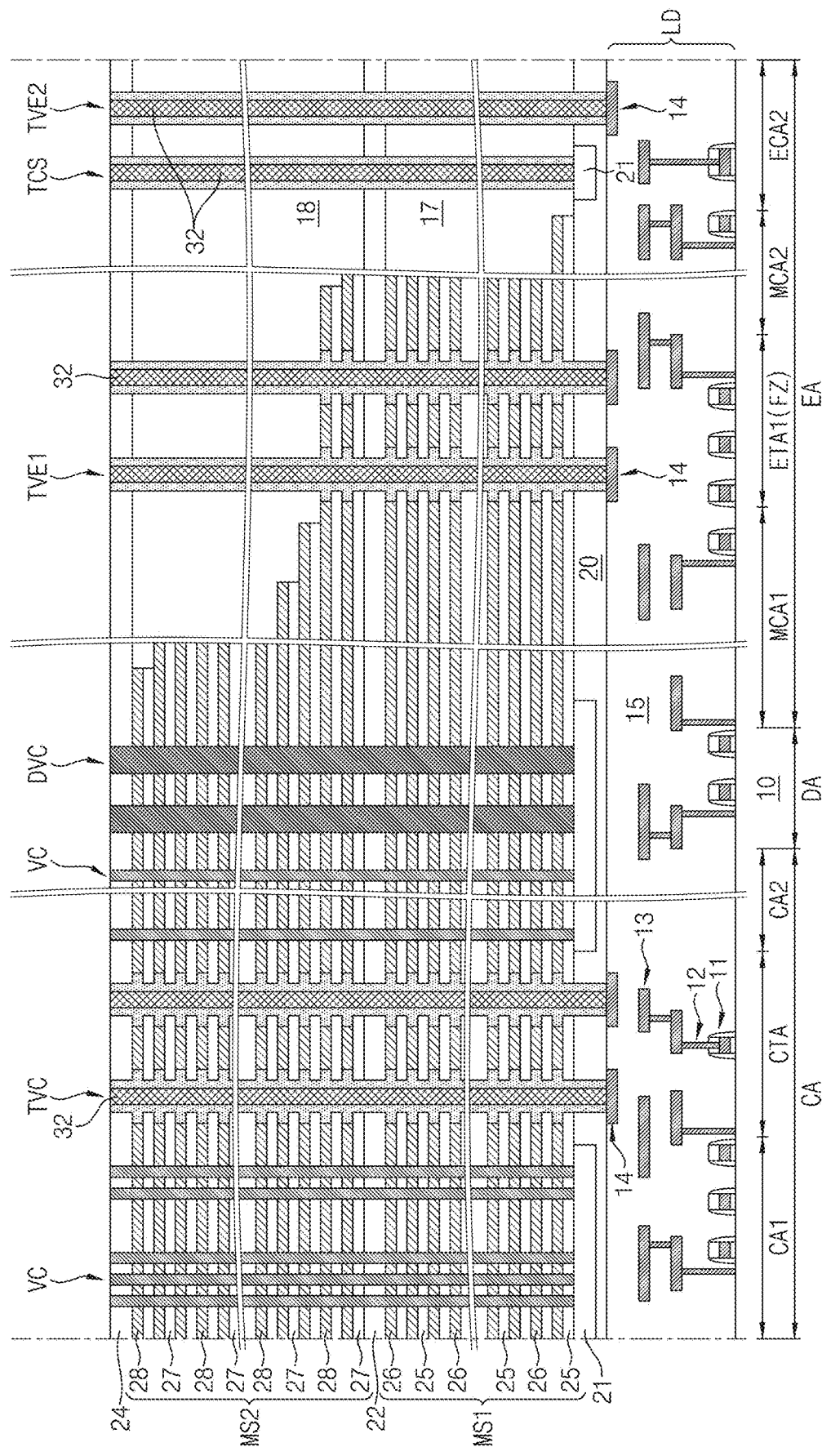

Referring to FIG. 13A, the method may include filling insides of the cell through-via hole Hcv, the first and second extension through-via holes Hev1 and Hev2, and the common source via hole Hcs with a conductive material to form a cell through-via structure TVC, first and second extension through-via structures TVE1 and TVE2, and a common source via TCS. The cell through-via structure TVC, the first and second extension through-via structures TVE1 and TVE2, and the common source via TCS may include a via liner layer 31 and a central via plug 32, respectively. The via plug 32 may include a metal, a metal compound, and/or a metal alloy.

Figure 13B:
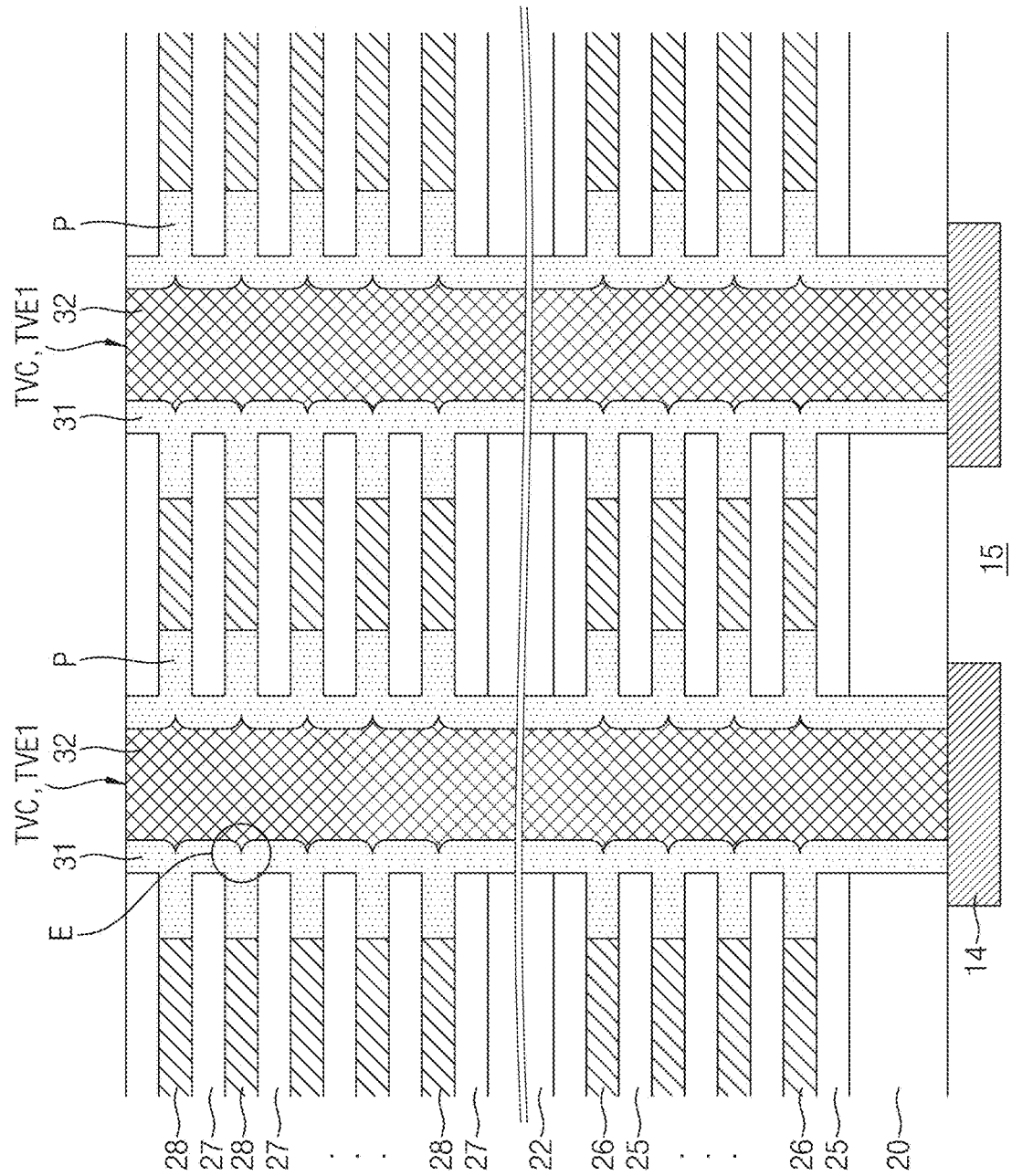

FIG. 13B is a partially enlarged view of FIG. 13A. Referring to FIG. 13B, the via plug 32 may include edge portions E filling the dents D. In a horizontal cross-sectional view or a top view, the edges E may have a ring shape or a disk shape. In other embodiments, small voids may be remain for formed between the via plug 32 and the dents D.

Figure 14:
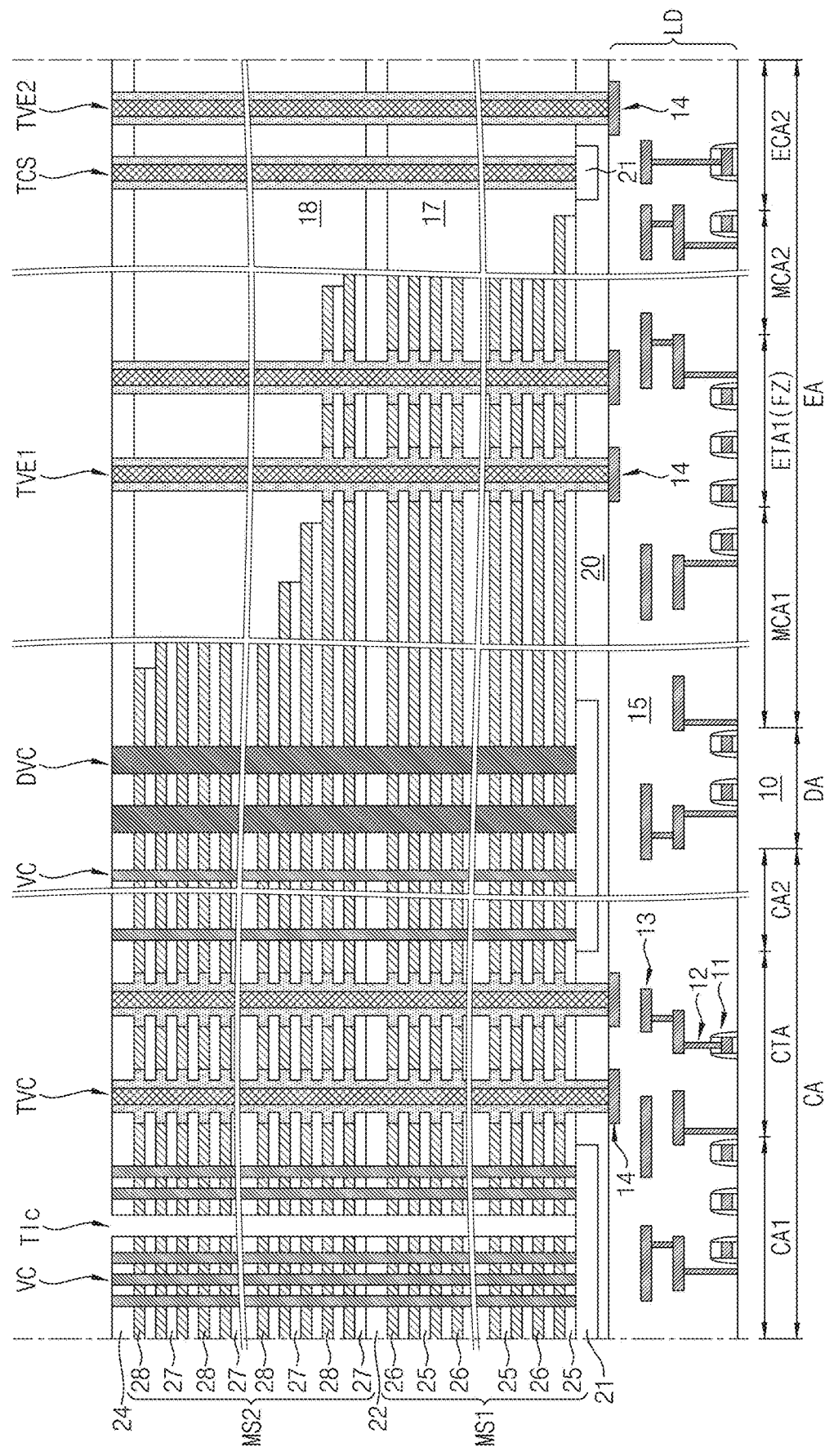

Referring to FIG. 14, the method may include forming a word line cut trench Tlc in the cell area CA. The word line cut trench Tlc may be disposed between the vertical structures VC in the cell area CA to expose a top surface of the common source layer 21. Referring to FIGS. 1A to 1D, the word line cut trench Tlc may have a line shape or a plurality of segments shape in a top view. For example, the word line cut trench Tlc may include a first trench to form a first word line cut structure LC1, a second trench to form a second word line cut structure LC2, and a third trench to form third word line cut structures. That is, the trenches to form the word line cut structures LC1, LC2, and LC3 may be formed at the same time.

Figure 15:
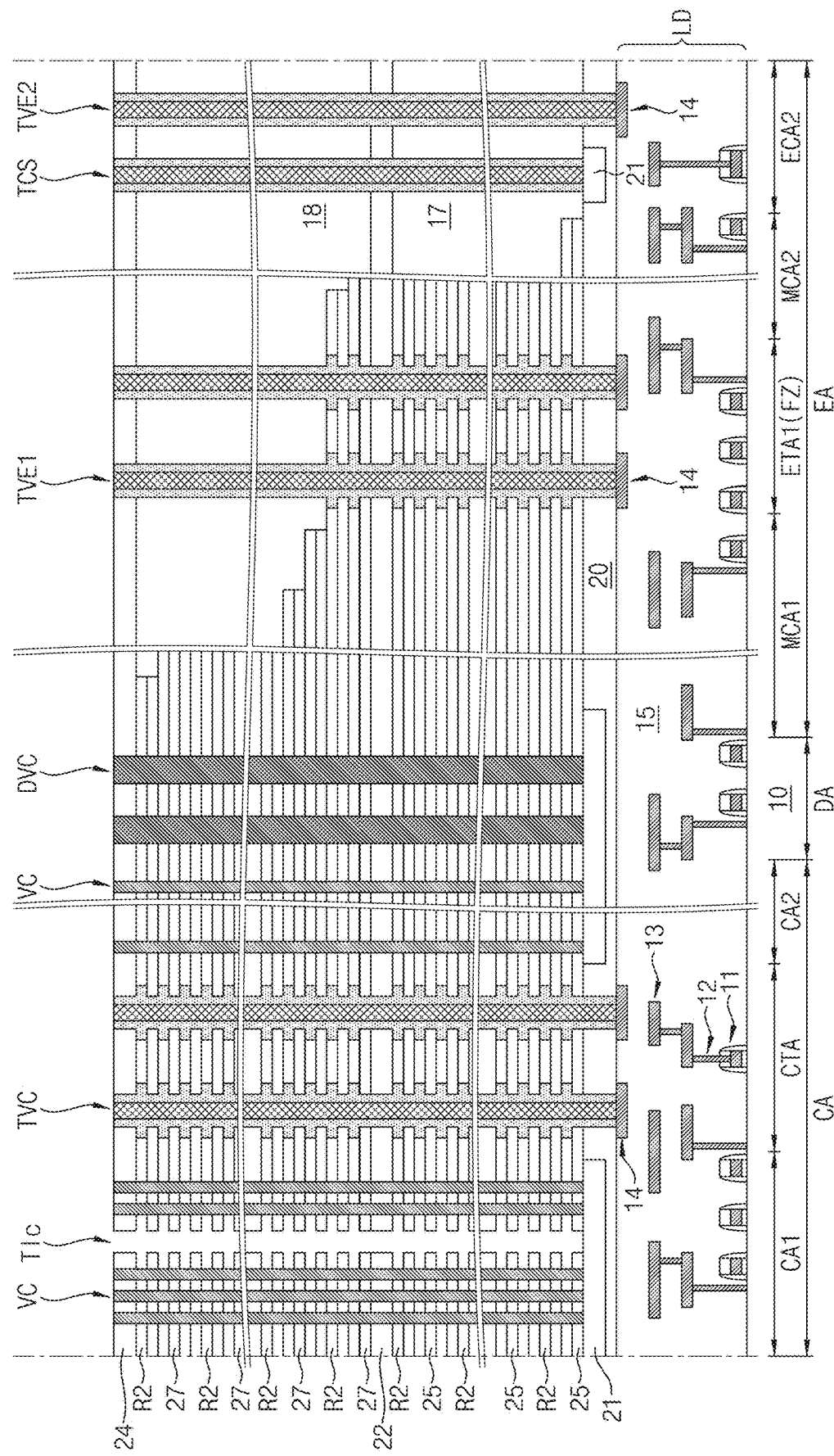

Referring to FIG. 15, the method may include performing a removal process to remove the upper sacrificial layers 28 and the lower sacrificial layers 26 through the word line cut trench Tlc. By removing the upper sacrificial layers 28 and the lower sacrificial layers 26, recesses R2 for forming word lines may be formed. The removing process may include a wet full-back etching process using phosphoric acid ($H_3PO_4$).

Figure 16:
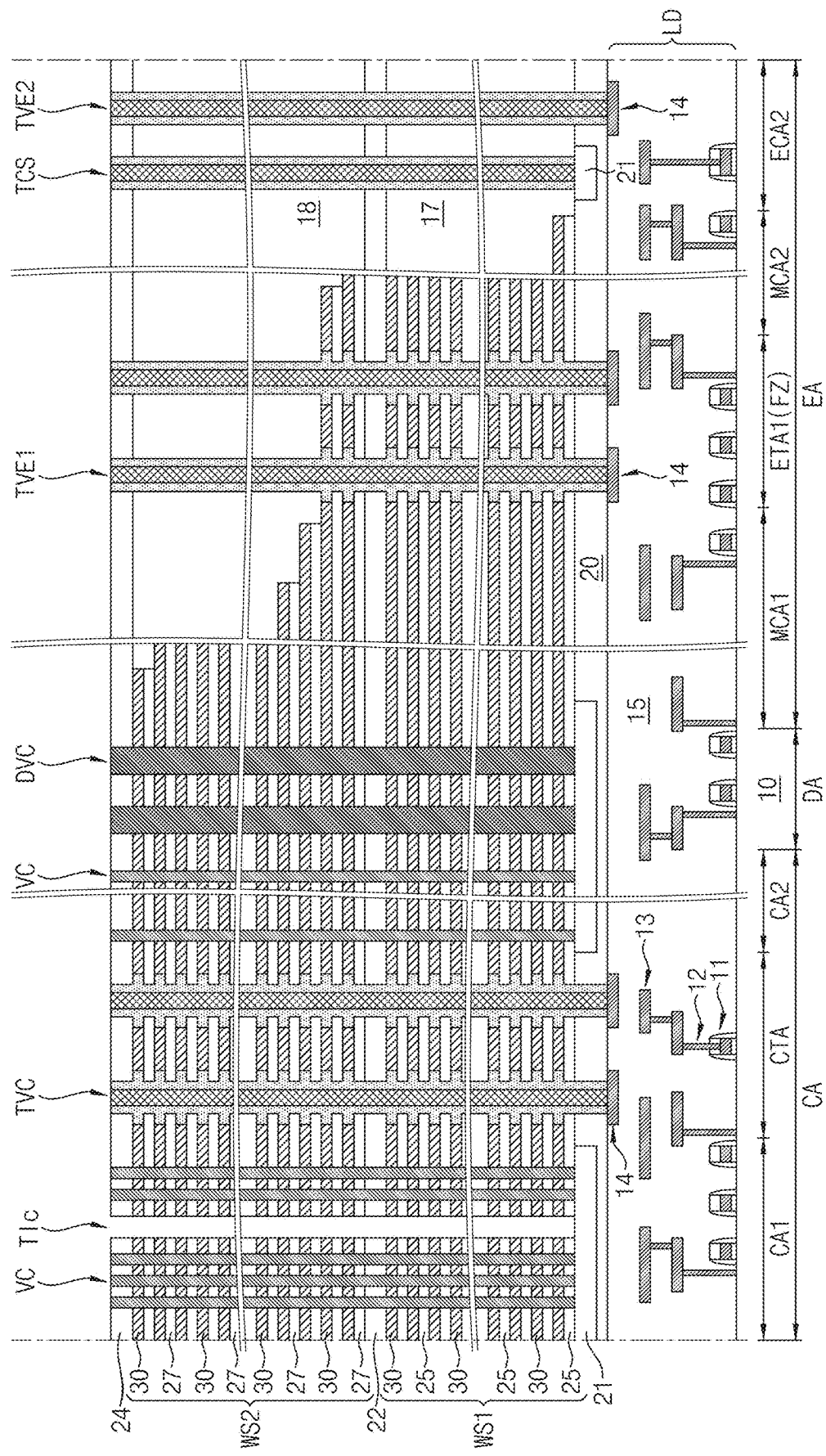

Referring to FIG. 16, the method may include performing a word line replacement process to form word lines 30 in the recesses R2. Each of the word lines 30 may include a word line barrier layer and a word line electrode. The word line barrier layer may include an insulating barrier layer such as aluminum oxide ($Al_2O_3$) and a conductive barrier layer such as titanium nitride (TiN). The word line electrode may include a metal such as tungsten (W). In the process, the lower mold stack MS1 may be formed to the lower word line stack WS1, and the upper mold stack MS2 may be formed to the upper word line stack WS2. Accordingly, the lower word line stack WS1 may include alternately stacked lower mold layers 25 and word lines 30, and the upper word line stack WS2 may alternately stack the upper mold layer 27 and word lines 30.

Figure 17:
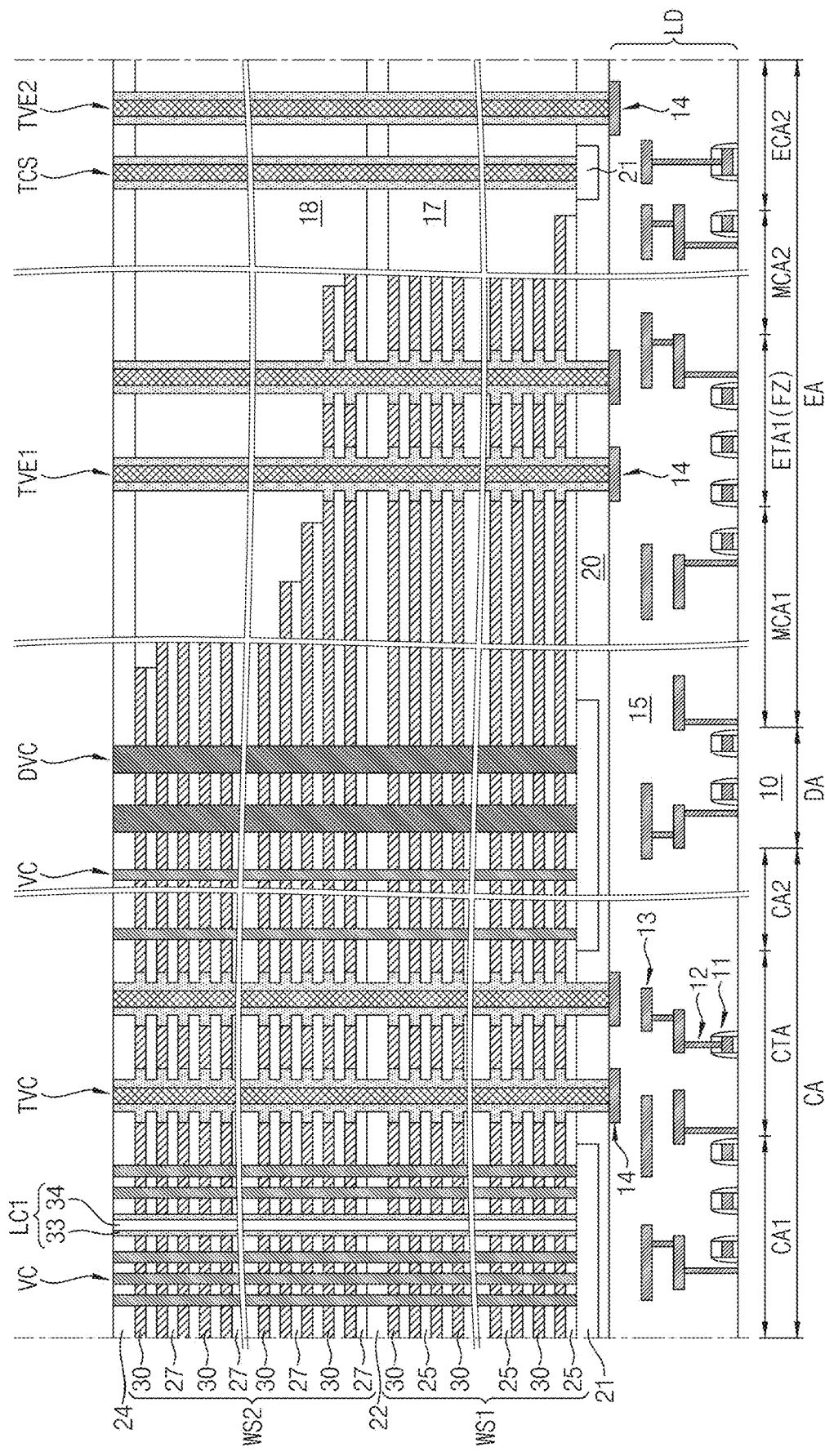

Referring to FIG. 17, the method may include filling insides of a word line cut trench Tlc to form a word line cut structure WL. The forming the word line cut structure WL may include forming a line cut structure LC1 including a trench liner layer 33 and a trench plug 34 in the word line cut trench Tlc. The trench plug 34 may be electrically connected to the common source layer 21. The forming the trench liner layer 33 may include performing a deposition process and an etch-back process. The trench liner layer 33 may include an insulator, such as silicon oxide. The forming the trench plug 34 may include performing a deposition process and a planarization process. The trench plug 34 may include a conductor such as metal or doped silicon.

Figure 18:
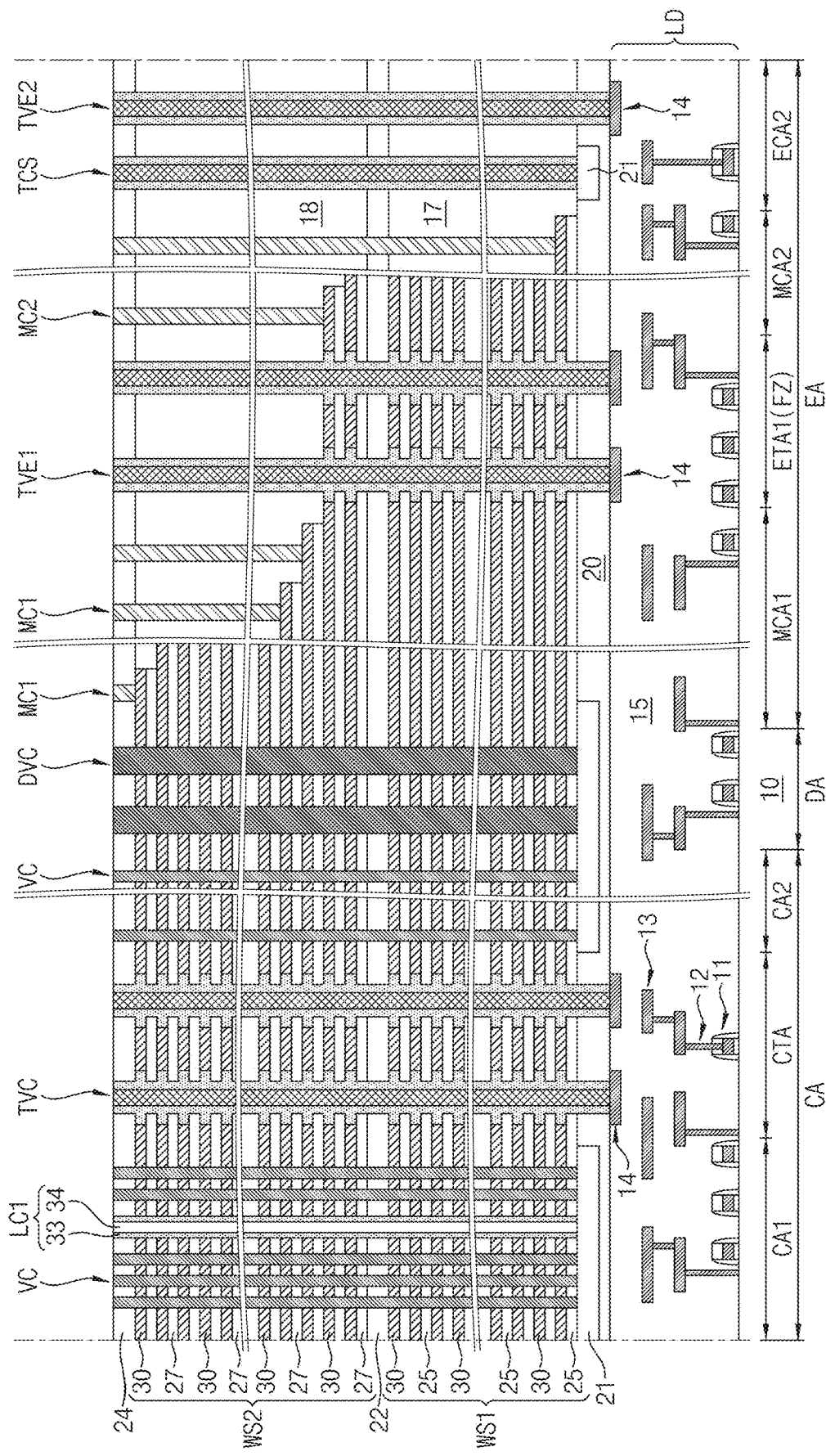

Referring to FIG. 18, the method may include forming first and second word line contacts MC1 and MC2 in the extension area EA. The first word line contacts MC1 may be disposed in the first word line contact area MCA1 of the extension area EA, and the second word line contacts MC2 may be disposed in the second word line contact area MCA2 of the extension area EA. The first word line contacts MC1 and the second word line contacts MC2 may selectively vertically penetrating the upper interlayer insulating layer 24, the upper staircase insulating layer 18, the middle interlayer insulating layer 22, and the lower staircase insulating layer 17 to be landed on ends of the word lines 30 having the staircase, respectively.

Subsequently, referring to FIG. 2A, the method may include forming capping layers 41-43, vertical conductors 51-55, and horizontal conductors 61-65 on the upper word line stack WS2. The forming the capping layers 41-43 may include forming a lower capping layer 41, a middle capping layer 42, and an upper capping layer 43. The forming the vertical conductors 51-55 may include a vertical channel via plug 51, a cell through-via stud 52, an extension through-via stud 53, a common source via plug 54, and a word line via plug 55. The forming the horizontal conductors 61-65 may include a bit line 61, a cell through-via connection conductor 62, an extension through-via connection conductor 63, a common source connection conductor 64, and a word line connection conductor 65. At least one of the vertical conductors 51-55 and at least one of the horizontal conductors 61-65 may selectively be omitted. The capping layers 41-43 may include an insulating material such as silicon oxide. The vertical conductors 51-55 and the horizontal conductors 61-65 may include a conductive material such as metal.

Figure 19A:
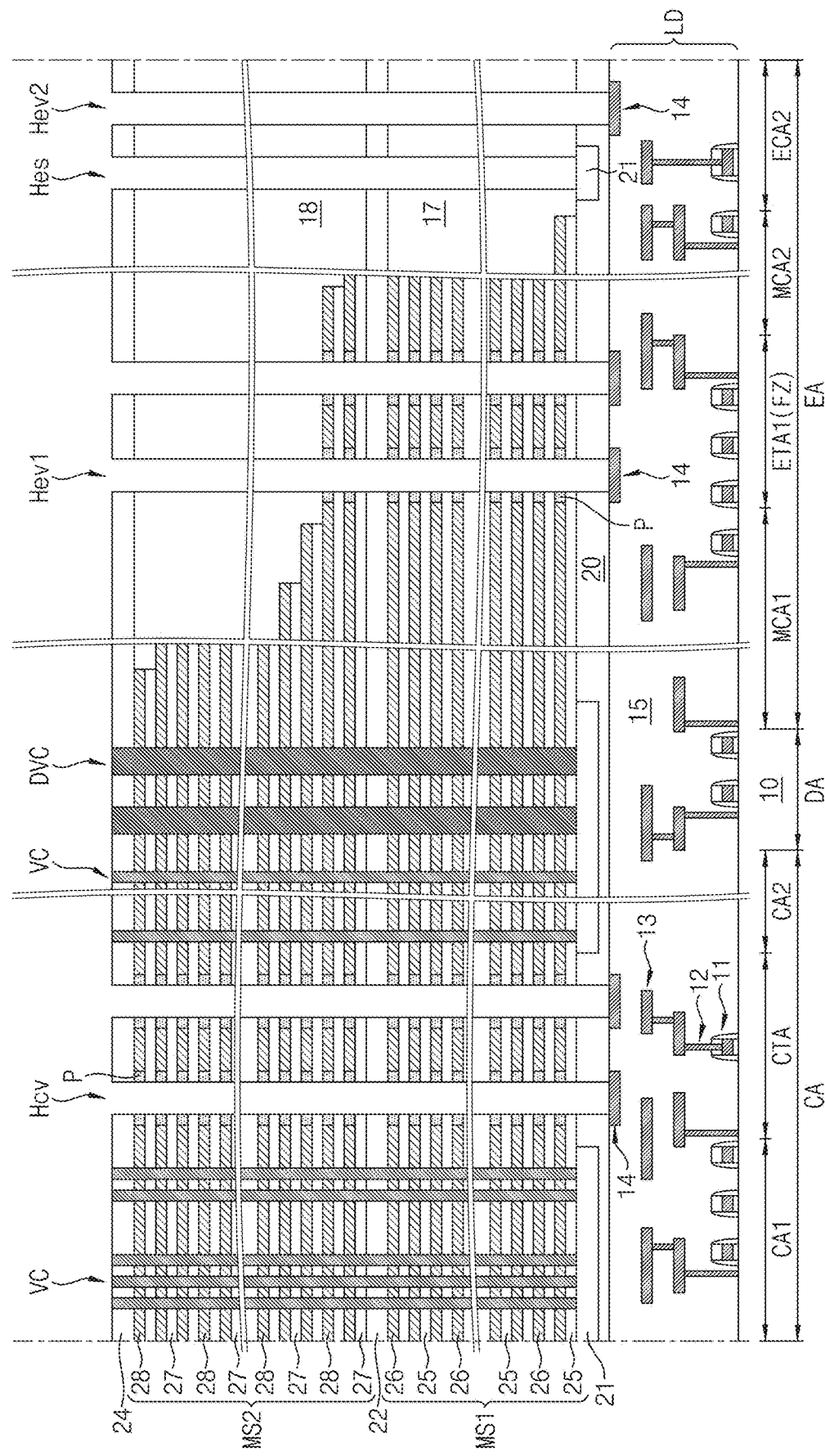

FIGS. 19A to 19C are views illustrating a method of forming a three-dimensional semiconductor device according to some example embodiments of the present disclosure. Referring to FIGS. 19A and 19B, a method of forming a three-dimensional semiconductor device according to some example embodiments of the present disclosure may include performing the processes described with reference to FIGS. 3 to 12A and 12B and performing an etch-back process to remove the dents D shown in FIG. 12B. The via liner layers 31 may remain only in the recess portions R1. For example, only the protruding portions P may be formed. The protruding portions P may have a ring shape in a top view.

Referring to FIG. 19C, the method may include forming via liner layers 31 on inner walls of the cell through-via hole Hcv, the first and second extension through-via holes Hev1 and Hev2, and the common source via hole Hcs. The inner sidewall of the via liner layer 31 may be flat without any dents D.

Subsequently, the method may include performing the processes described with reference to FIGS. 13A and 13B to FIG. 18, and further performing the processes described with reference to FIGS. 2A and 2B.

The three-dimensional semiconductor device according to example embodiments of the present disclosure does not include a box area for forming the through-via structures, and the integration degree may be improved since the through-via structures may be formed in a narrow area.

In the three-dimensional semiconductor device according to the example embodiments of the present disclosure, since the width between the word lines and the through-via structures is widened, the operation of the device may be faster and power consumption may be lowered.

Methods of forming a three-dimensional semiconductor device according to example embodiments of the present disclosure provides to form a through-via structure before a word line cut structure. Thus, the process margin for forming the through-via structure can be improved.

While the example embodiments of the present disclosure have been described with reference to the accompanying drawings, it should be understood by those skilled in the art that various modifications may be made without departing from the scope of the present disclosure and without changing essential features thereof. Therefore, the above-described embodiments should be considered in a descriptive sense only and not for purposes of limitation.

What is claimed is:

1. A three-dimensional semiconductor device, comprising:
   a stack structure, the stack structure including mold layers and word lines alternately stacked;
   a vertical channel structure vertically penetrating the stack structure in a vertical direction; and
   a first conductive plug vertically penetrating the stack structure in the vertical direction and spaced apart from the word lines;
   word line contact plugs contacting and electrically connected to the word lines; and
   a first insulating layer between the stack structure and the first conductive plug,
   wherein the word lines and the mold layers include a first word line and a first mold layer above the first word line,
   wherein the first conductive plug penetrates through the first word line and the first mold layer,
   wherein the first conductive plug includes:
      a first plug portion at the same level as the first word line; and
      a second plug portion at the same level as the first mold layer, an outermost layer of the first plug portion being a same material as an outermost layer of the second plug portion,
   wherein a maximum width of the first plug portion is greater than a maximum width of the second plug portion,
   wherein the first conductive plug includes a first conductive material layer and is spaced apart from the vertical channel structure,
   wherein a lower end of the first conductive material layer is at a lower level than a lowermost word line among the word lines,
   wherein an upper end of the first conductive material layer is at a higher level than an uppermost word line among the word lines,
   wherein the vertical channel structure includes a memory layer and does not include the first conductive material layer, and
   wherein the first conductive plug does not include the memory layer.

2. The three-dimensional semiconductor device of claim 1, wherein a minimum distance between the first plug portion and the first word line is greater than a maximum distance between the second plug portion and the first mold layer.

3. The three-dimensional semiconductor device of claim 1, wherein the first insulating layer includes:
   a first insulating portion between the first plug portion and the first word line; and
   a second insulating portion between the second plug portion and the first mold layer, and
   wherein a width of the first insulating portion is greater than a width of the second insulating portion.

4. The three-dimensional semiconductor device of claim 1, further comprising:
   a second conductive plug vertically penetrating the stack structure and adjacent to the first conductive plug; and
   a second insulating layer contacting a side surface of the second conductive plug,
   wherein the first word line surrounds the first and second conductive plugs, and is not between the first and second conductive plugs.

5. The three-dimensional semiconductor device of claim 4, wherein the second insulating layer extends from the first insulating layer.

6. The three-dimensional semiconductor device of claim 1, further comprising a common source layer vertically overlapping the stack structure,
   wherein the vertical channel structure contacts the common source layer, and
   wherein the first conductive plug is spaced apart from the common source layer.

7. The three-dimensional semiconductor device of claim 6, wherein the common source layer includes a doped polysilicon layer, and
   wherein the doped polysilicon layer is spaced apart from the first conductive plug.

8. The three-dimensional semiconductor device of claim 6, further comprising:
   a substrate; and
   a logic device, wherein the common source layer is between the substrate and the stack structure,
wherein the logic device is between the common source layer and the substrate.

9. The three-dimensional semiconductor device of claim 8, wherein a lower surface of the first conductive plug is at a lower level than a lower surface of the common source layer,
wherein an upper surface of the first conductive plug is at a higher level than the uppermost word line among the word lines.

10. A three-dimensional semiconductor device, comprising:
a stack structure, the stack structure including mold layers and word lines alternately stacked;
a vertical channel structure vertically penetrating the stack structure in a vertical direction; and
a conductive plug vertically penetrating the stack structure in the vertical direction and spaced apart from the word lines;
word line contact plugs contacting and electrically connected to the word lines; and
an insulating layer between the stack structure and a side surface of the conductive plug,
wherein the word lines and the mold layers include a first word line and a first mold layer adjacent to each other in the vertical direction,
wherein the conductive plug penetrates through the first word line and the first mold layer,
wherein the conductive plug includes:
a first plug portion at the same level as the first word line; and
a second plug portion at the same level as the first mold layer, an outermost layer of the first plug portion being a same material as an outermost layer of the second plug portion, and
wherein the first plug portion includes:
a first level portion at the same level as a lower surface of the first word line;
a second level portion at the same level as an upper surface of the first word line; and
a third level portion between the first level portion and the second level portion, and
wherein a width of the third level portion is greater than a width of each of first and second level portions,
wherein the conductive plug includes a first conductive material layer and is spaced apart from the vertical channel structure,
wherein a lower end of the first conductive material layer is at a lower level than a lowermost word line among the word lines,
wherein an upper end of the first conductive material layer is at a higher level than an uppermost word line among the word lines,
wherein the vertical channel structure includes a memory layer and does not include the first conductive material layer, and
wherein the conductive plug does not include the memory layer.

11. The three-dimensional semiconductor device of claim 10, wherein the third level portion is at the same level as a center between the lower surface of the first word line and the upper surface of the first word line.

12. The three-dimensional semiconductor device of claim 11, wherein the width of the third level portion is substantially a maximum width of the first plug portion.

13. The three-dimensional semiconductor device of claim 10, wherein the first insulating layer includes:
a first insulating portion between the first plug portion and the first word line; and
a second insulating portion between the second plug portion and the first mold layer, and
wherein a width of the first insulating portion is greater than a width of the second insulating portion.

14. The three-dimensional semiconductor device of claim 10, further comprising a common source layer vertically overlapping the stack structure,
wherein the vertical channel structure contacts the common source layer,
wherein the conductive plug is spaced apart from the common source layer, and
wherein a lower surface of the conductive plug is at a lower level than a lower surface of the common source layer.

15. The three-dimensional semiconductor device of claim 14, further comprising:
a substrate; and
a logic device,
wherein the common source layer is between the substrate and the stack structure,
wherein the logic device is between the common source layer and the substrate.

16. A three-dimensional semiconductor device, comprising:
a stack structure, the stack structure including mold layers and word lines alternately stacked;
a vertical channel structure vertically penetrating the stack structure in a vertical direction; and
a conductive plug vertically penetrating the stack structure in the vertical direction and spaced apart from the word lines;
word line contact plugs contacting and electrically connected to the word lines;
an insulating layer between the stack structure and the conductive plug,
wherein the word lines and the mold layers include a first word line and a first mold layer above the first word line,
wherein the conductive plug penetrates through the first word line and the first mold layer,
wherein the conductive plug includes:
a first plug portion at the same level as the first word line; and
a second plug portion at the same level as the first mold layer, an outermost layer of the first plug portion being a same material as an outermost layer of the second plug portion,
wherein the first insulating layer includes:
a first insulating portion between the first plug portion and the first word line; and
a second insulating portion between the second plug portion and the first mold layer, and
wherein a distance between the first plug portion and the first word line is greater than a distance between the second plug portion and the first mold layer,
wherein the conductive plug includes a first conductive material layer and is spaced apart from the vertical channel structure,
wherein a lower end of the first conductive material layer is at a lower level than a lowermost word line among the word lines, wherein an upper end of the first conductive material layer is at a higher level than an uppermost word line among the word lines, wherein the vertical channel structure includes a memory layer and does not include the first conductive material layer, and wherein the conductive plug does not include the memory layer.

17. The three-dimensional semiconductor device of claim 16, wherein the first plug portion includes:
   a lower portion;
   an upper portion on the lower portion; and
   an intermediate portion between the lower portion and the upper portion, and wherein a width of the intermediate portion is greater than a width of each of the lower portion and the upper portion.

18. The three-dimensional semiconductor device of claim 17, wherein the intermediate portion of the first plug portion does not vertically overlap the first mold layer and the first word line, and wherein, in a top view, the first word line surrounds a side surface of the first plug portion.

* * * * *